United States Patent
Shatalov et al.

(10) Patent No.: US 9,818,826 B2
(45) Date of Patent: Nov. 14, 2017

(54) HETEROSTRUCTURE INCLUDING A COMPOSITE SEMICONDUCTOR LAYER

(71) Applicant: Sensor Electronic Technology, Inc., Columbia, SC (US)

(72) Inventors: Maxim S. Shatalov, Columbia, SC (US); Rakesh Jain, Columbia, SC (US); Jinwei Yang, Columbia, SC (US); Alexander Dobrinsky, Loudonville, NY (US); Michael Shur, Latham, NY (US); Remigijus Gaska, Columbia, SC (US)

(73) Assignee: Sensor Electronic Technology, Inc., Columbia, SC (US)

(*) Notice: Subject to any disclaimer, the term of this patent is extended or adjusted under 35 U.S.C. 154(b) by 69 days.

(21) Appl. No.: 14/519,230

(22) Filed: Oct. 21, 2014

(65) Prior Publication Data
US 2015/0108428 A1    Apr. 23, 2015

Related U.S. Application Data

(60) Provisional application No. 61/893,364, filed on Oct. 21, 2013.

(51) Int. Cl.
*H01L 29/15* (2006.01)
*H01L 33/00* (2010.01)
(Continued)

(52) U.S. Cl.
CPC ........ *H01L 29/151* (2013.01); *H01L 21/0242* (2013.01); *H01L 21/0243* (2013.01);
(Continued)

(58) Field of Classification Search
CPC ... H01L 29/15; H01L 29/151; H01L 29/2003; H01L 29/205; H01L 33/0025;
(Continued)

(56) References Cited

U.S. PATENT DOCUMENTS

| 5,538,767 A | 7/1996 | Cava et al. |
| 5,608,230 A * | 3/1997 | Hirayama ............... B82Y 20/00 257/18 |

(Continued)

FOREIGN PATENT DOCUMENTS

| CN | 101410950 A | 4/2009 |
| CN | 102368526 A | 3/2012 |

(Continued)

OTHER PUBLICATIONS

Raghavan, "Dislocation bending and tensile stress generation in GaN and AlGaN films,"Journal of Crystal Growth 359, 2012, pp. 35-42.

(Continued)

*Primary Examiner* — Maliheh Malek
(74) *Attorney, Agent, or Firm* — LaBatt, LLC

(57) ABSTRACT

A heterostructure for use in an electronic or optoelectronic device is provided. The heterostructure includes one or more composite semiconductor layers. The composite semiconductor layer can include sub-layers of varying morphology, at least one of which can be formed by a group of columnar structures (e.g., nanowires). Another sub-layer in the composite semiconductor layer can be porous, continuous, or partially continuous.

20 Claims, 14 Drawing Sheets

(51) Int. Cl.
  *H01L 33/12* (2010.01)
  *H01L 29/20* (2006.01)
  *H01L 29/205* (2006.01)
  *H01L 29/06* (2006.01)
  *H01L 21/02* (2006.01)

(52) U.S. Cl.
  CPC ...... *H01L 21/0254* (2013.01); *H01L 21/0262* (2013.01); *H01L 21/0265* (2013.01); *H01L 21/02458* (2013.01); *H01L 21/02505* (2013.01); *H01L 21/02513* (2013.01); *H01L 21/02587* (2013.01); *H01L 21/02639* (2013.01); *H01L 29/068* (2013.01); *H01L 29/0676* (2013.01); *H01L 29/2003* (2013.01); *H01L 29/205* (2013.01); *H01L 33/0075* (2013.01); *H01L 33/12* (2013.01)

(58) Field of Classification Search
  CPC ............. H01L 33/0062; H01L 33/0066; H01L 33/007; H01L 33/0075; H01L 33/04; H01L 33/06; H01L 33/12; H01L 33/16; H01L 33/18; H01L 33/32
  See application file for complete search history.

(56) References Cited

U.S. PATENT DOCUMENTS

| | | | |
|---|---|---|---|
| 6,130,142 A | 10/2000 | Westwater et al. | |
| 7,303,631 B2 | 12/2007 | Conley et al. | |
| 7,309,621 B2 | 12/2007 | Conley et al. | |
| 7,407,872 B2 | 8/2008 | Han et al. | |
| 7,445,742 B2 | 11/2008 | Chen et al. | |
| 7,491,626 B2 | 2/2009 | Gaska et al. | |
| 7,745,315 B1 | 6/2010 | Wang et al. | |
| 7,776,636 B2 | 8/2010 | Wang | |
| 7,856,042 B2* | 12/2010 | Botez | B82Y 20/00 372/43.01 |
| 8,383,493 B2* | 2/2013 | Wang | 257/E21.561 |
| 8,410,496 B2 | 4/2013 | Hersee et al. | |
| 8,574,935 B2* | 11/2013 | Yu | H01L 33/007 257/E33.001 |
| 8,624,108 B1* | 1/2014 | Dutta | H01L 31/03522 136/252 |
| 8,791,359 B2* | 7/2014 | Dutta | H01L 31/035209 136/252 |
| 8,879,598 B2* | 11/2014 | Shur | H01L 21/02518 372/45.012 |
| 9,048,343 B2* | 6/2015 | Kim | H01L 33/0079 |
| 9,117,983 B2* | 8/2015 | Bilenko | H01L 24/94 |
| 9,142,741 B2* | 9/2015 | Shatalov | H01L 33/20 |
| 9,209,358 B2* | 12/2015 | Seo | H01L 21/0237 |
| 9,281,441 B2* | 3/2016 | Shur | H01L 33/18 |
| 9,287,449 B2* | 3/2016 | Gaska | H01L 33/22 |
| 9,324,560 B2* | 4/2016 | Shatalov | H01L 21/0237 |
| 9,331,233 B2* | 5/2016 | Dussaigne | H01L 33/0075 |
| 9,337,387 B2* | 5/2016 | Shatalov | F21V 5/002 |
| 9,406,840 B2* | 8/2016 | Shur | H01L 33/32 |
| 9,634,189 B2* | 4/2017 | Shatalov | H01L 33/22 |
| 9,653,631 B2* | 5/2017 | Jain | H01L 31/035272 |
| 2004/0144970 A1 | 7/2004 | Wang et al. | |
| 2004/0175852 A1* | 9/2004 | Ooi | B82Y 20/00 438/22 |
| 2004/0262636 A1 | 12/2004 | Yang et al. | |
| 2006/0019470 A1 | 1/2006 | Seifert et al. | |
| 2006/0068601 A1 | 3/2006 | Lee et al. | |
| 2006/0073680 A1 | 4/2006 | Han et al. | |
| 2006/0091408 A1* | 5/2006 | Kim | H01L 21/02381 257/94 |
| 2006/0112466 A1 | 5/2006 | Den | |
| 2006/0223211 A1 | 10/2006 | Mishra et al. | |
| 2006/0273328 A1 | 12/2006 | Niu et al. | |
| 2007/0001220 A1 | 1/2007 | Tombler et al. | |
| 2007/0172183 A1 | 7/2007 | Wang | |
| 2007/0204901 A1* | 9/2007 | Dutta | H01L 31/035281 136/256 |
| 2007/0204902 A1* | 9/2007 | Dutta | H01L 31/035281 136/256 |
| 2007/0257264 A1 | 11/2007 | Hersee et al. | |
| 2007/0286945 A1 | 12/2007 | Lahnor et al. | |
| 2008/0036038 A1 | 2/2008 | Hersee et al. | |
| 2008/0169745 A1* | 7/2008 | Tolt | H01J 1/304 313/310 |
| 2009/0039754 A1* | 2/2009 | Tolt | H01J 3/022 313/310 |
| 2009/0079034 A1* | 3/2009 | Wang | H01L 21/02609 257/615 |
| 2009/0079035 A1* | 3/2009 | Wang | B82Y 30/00 257/615 |
| 2009/0087639 A1* | 4/2009 | Li | H05K 7/20963 428/304.4 |
| 2009/0174038 A1* | 7/2009 | Wang | C30B 25/00 257/618 |
| 2009/0243043 A1 | 10/2009 | Wang | |
| 2009/0309458 A1* | 12/2009 | Chou | H02N 2/18 310/339 |
| 2010/0019355 A1 | 1/2010 | Kamins et al. | |
| 2010/0127238 A1* | 5/2010 | Kim | H01L 33/387 257/13 |
| 2010/0264401 A1 | 10/2010 | Adivarahan et al. | |
| 2010/0276665 A1* | 11/2010 | Wang | H01L 21/0237 257/15 |
| 2010/0320440 A1* | 12/2010 | Khan | B82Y 20/00 257/13 |
| 2010/0320444 A1* | 12/2010 | Dutta | H01L 25/042 257/21 |
| 2011/0124139 A1* | 5/2011 | Chang | C30B 25/18 438/40 |
| 2011/0175126 A1 | 7/2011 | Yang et al. | |
| 2011/0198648 A1* | 8/2011 | Jung | H01L 33/20 257/98 |
| 2011/0215295 A1 | 9/2011 | Lugauer et al. | |
| 2011/0260211 A1* | 10/2011 | Cheng | H01L 33/007 257/103 |
| 2011/0272671 A1* | 11/2011 | Skiba-Szymanska | B82Y 10/00 257/14 |
| 2011/0291074 A1 | 12/2011 | Strittmatter et al. | |
| 2012/0018764 A1* | 1/2012 | Choi | H01L 33/08 257/99 |
| 2012/0138980 A1* | 6/2012 | Kuo | H01L 31/035227 257/94 |
| 2012/0187445 A1* | 7/2012 | Oh | H01L 21/0237 257/99 |
| 2012/0211073 A1* | 8/2012 | Nagao | H01L 31/035281 136/256 |
| 2012/0273749 A1* | 11/2012 | Hsia | H01L 33/007 257/13 |
| 2012/0273827 A1* | 11/2012 | Wei | B82Y 20/00 257/99 |
| 2012/0280243 A1* | 11/2012 | Lee | H01L 21/0237 257/76 |
| 2013/0021669 A1* | 1/2013 | Xi | G02B 26/001 359/578 |
| 2013/0056770 A1* | 3/2013 | Shatalov | H01L 21/0237 257/94 |
| 2013/0177738 A1* | 7/2013 | Mardilovich | B81C 1/00031 428/141 |
| 2013/0187124 A1 | 7/2013 | Zhang et al. | |
| 2013/0214300 A1* | 8/2013 | Lerman | H01L 25/0753 257/88 |
| 2013/0221406 A1* | 8/2013 | Gaska | H01L 29/66431 257/191 |
| 2013/0228809 A1* | 9/2013 | Chang | H01L 33/0079 257/98 |
| 2013/0234178 A1* | 9/2013 | Mitsugi | H01L 33/60 257/94 |
| 2013/0270519 A1* | 10/2013 | Sun | H01L 33/06 257/13 |
| 2013/0288458 A1* | 10/2013 | Wei | H01L 21/20 438/478 |

(56) References Cited

U.S. PATENT DOCUMENTS

| | | | | |
|---|---|---|---|---|
| 2014/0016660 A1* | 1/2014 | Lunev | ............... | H01L 33/40 372/46.01 |
| 2014/0064314 A1* | 3/2014 | Shur | ............... | H01L 33/06 372/45.012 |
| 2014/0110663 A1* | 4/2014 | Choi | ............... | H01L 33/007 257/13 |
| 2014/0110754 A1* | 4/2014 | Jain | ............... | H01L 21/0237 257/190 |
| 2014/0239312 A1* | 8/2014 | Shatalov | ............... | H01L 33/32 257/76 |
| 2014/0299968 A1* | 10/2014 | Wang | ............... | H01L 21/0237 257/618 |
| 2014/0327037 A1* | 11/2014 | Dussaigne | ............... | H01L 21/0237 257/103 |
| 2014/0353679 A1* | 12/2014 | Seo | ............... | H01L 21/0237 257/76 |
| 2015/0091043 A1* | 4/2015 | Shur | ............... | H01L 33/382 257/99 |
| 2015/0243841 A1* | 8/2015 | Shatalov | ............... | H01L 33/0025 257/13 |
| 2015/0255672 A1* | 9/2015 | Shur | ............... | H01L 33/06 257/13 |
| 2015/0364443 A1* | 12/2015 | Bilenko | ............... | H01L 24/94 257/773 |
| 2016/0005925 A1* | 1/2016 | Kim | ............... | H01L 33/14 257/76 |
| 2016/0111618 A1* | 4/2016 | Shur | ............... | H01L 33/641 257/94 |
| 2016/0118531 A1* | 4/2016 | Jain | ............... | H01L 33/04 257/94 |
| 2016/0118534 A1* | 4/2016 | Shur | ............... | H01L 33/32 257/13 |
| 2016/0118535 A1* | 4/2016 | Lunev | ............... | H01L 33/38 257/13 |
| 2016/0155902 A1* | 6/2016 | Lunev | ............... | H01L 33/405 257/98 |
| 2016/0172544 A1* | 6/2016 | Gaska | ............... | H01L 33/32 257/13 |
| 2016/0190387 A1* | 6/2016 | Sun | ............... | H01L 21/02458 438/47 |
| 2016/0343901 A1* | 11/2016 | Shur | ............... | H01L 33/007 |
| 2017/0005224 A1* | 1/2017 | Shur | ............... | H01L 33/0079 |
| 2017/0098739 A1* | 4/2017 | Gaevski | ............... | H01L 33/387 |
| 2017/0104129 A1* | 4/2017 | Jain | ............... | H01L 21/0242 |
| 2017/0104131 A1* | 4/2017 | Shatalov | ............... | H01L 33/22 |
| 2017/0104135 A1* | 4/2017 | Shur | ............... | H01L 33/486 |
| 2017/0110628 A1* | 4/2017 | Shatalov | ............... | G06F 17/505 |
| 2017/0117438 A1* | 4/2017 | Shur | ............... | H01L 33/06 |

FOREIGN PATENT DOCUMENTS

| | | |
|---|---|---|
| JP | 2006100501 A | 4/2006 |
| JP | 2010521059 A | 6/2010 |
| JP | 2012507840 A | 3/2012 |
| KR | 20090069304 A | 6/2009 |
| WO | 2007107757 A3 | 9/2007 |

OTHER PUBLICATIONS

Raghavan, "Kinetic approach to dislocation bending in low-mobility films," Physical Review B 83, 052102, 2011, 4 pages.
Li and Waag, "GaN based nanorods for solid state lighting", Journal of Applied Physics 111, 071101, 2012, 24 pages.
Hirayama, "222-282 nm AlGaN and InAlGaN based deep-UV LEDs fabricated on high quality AlN template," Proc. of SPIE vol. 7216, 721621, 14 pages.
Hirayama, "AlGaN-based Deep-UV LEDs Fabricated on Connected-Pillar AlN Buffer," 2013 Conference on Lasers and Electro-Optics Pacific Rim (CLEO-PR), 2 pages.
Zhao, "Surface morphology of AlN buffer layer and its effect on GaN growth by metalorganic chemical vapor deposition", Applied Physical letters vol. 85, No. 9, pp. 1499-1501, Aug. 30, 2004.
Zhang, "AlGaN-based 280nm light-emitting diodes with continuos-wave power exceeding 1mW at 25mA," Applied Physics Letters 85, pp. 5532-5534, Dec. 6, 2004.
Jain, "Migration enhanced lateral epitaxial overgrowth of AlN and AlGaN for high reliability deep ultraviolet light emitting diodes". Applied Physical Letters 93, p. 051113, 2008.
Balasubramanian, "Synthesis of nanowires anad nanoparticles of cubic aluminium nitride", Institute of Physics Publishing, Nanotechnology, vol. 15, No. 3, pp. 370-373, Mar. 2004.
Paul, "Formation of AlN nanowires using Al powder," Materials Chemistry and Physics 112 (2008), pp. 562-565.
Kim, "Temperature-controlled growth and photoluminescence of AlN nanowires," Applied Surface Science 255 (2009) pp. 7221-7225.
Lei, "Large-scale AlN nanowires synthesized by direct sublimation method," Journal of European Ceramic Society 29 (2009), pp. 195-200.
Lei, "Synthesis and characterization of straight and stacked-sheet AlN nanowires with high purity", Journal of Alloys and Compounds 459 (2008), pp. 338-342.
Zheng, "[0001] Oriented Aluminum Nitride One-Dimensional Nanostructures: Synthesis, Structure Evolution, and Electrical Properties", American Chemical Society Nano, vol. 2, No. 1, pp. 134-142, Jan. 2008.
Hau He, "Aligned AlN Nanorods with Multi-tipped Surfaces-Growth, Field-Emission, and Cathodoluminescence Properties," Advanced Materials 2006, 18, pp. 650-654.
Yang, "Controlled growth of aluminum nitride nanorod arrays via chemical vapour deposition," Nanotechnology 17 (2006) S321-S326.
Yazdi, "Aligned AlN nanowrires by self-organized vapor-solid growth," Nanotechnology, vol. 20, No. 49, p. 495304, Dec. 2009.
Cimalla, "Growth of AlN nanowires by metal organic chemical vapour deposition," Physica Status Solidi (b) 243, No. 7, pp. 1476-1480 (2006).
Zhao, "Optical properties of highly ordered AlN nanowire arrays grown on sapphire substrate," Applied Physics Letters, vol. 86, No. 19, p. 193101, 2005.
Kenry, "AlN nanowires: synthesis, physical properties, and nanoelectronics applications," Journal of Materials Science, vol. 47, No. 14, pp. 5341-5360, Mar. 2012.
Wu, "A simple route to aligned AlN nanowires," Diamond and Related Materials, vol. 13, No. 1, pp. 38-41, Jan. 2004.
Fundling, "GaN and ZnO nanostructures," Physica Status Solidi B 247, No. 10, pp. 2315-2328, 2010.
Song, "Selective area growth of GaN nanowires using metalroganic chemical vapor deposition on nano-patterned Si (111) formed by the etching of nano-sized Au droplets," Thin Solid Films 520 (2011), pp. 126-130.
Kipshidze, "Controlled growth of GaN nanowires by pulsed metalorganic chemical vapor deposition," Applied Physics letters 86, 033104 (2005), 4 pages.
Cui, "Morphology and growth mechanism of gallium nitride nanotowers synthesized by metal-organic chemical vapor deposition," Journal of Alloys and Compounds 563 (2013), pp. 72-76.
Kuo, "MOCVD growth of vertically aligned InGaN nanowrires," Journal of Crystal Growth 370 (2013) pp. 311-313.
Li and Wang, "Improvement in alligned GaN nanowire growth using submonolayer Ni catalyst films", Applied Physics Letters 93, 043119 (2008), 3 pages.
Lu, "Seeded growth of AlN on SiC substrates and defect characterization," Journal of Crystal Growth 310 (2008), pp. 2464-2470.
Shi, "Structural evolution of AlN nano-structure : Nanotips and nanorods," Chemical Physics Letters 418 (2006), pp. 152-157.
Zhang, "Synthesis of Aluminum Nitride from Carbon Nanotubes," Chemistry of Materials, vol. 13, No. 11, pp. 3899-3905, Nov. 2001.
Haber, "Morphological Control of Nanocrystalline Aluminum Nitride: Aluminum Chloride-Assisted Nnaowhisker Growth," American Chemical Society., vol. 119, No. 23, 1997, 2 pages.
Tang, "Catalyst-seeded synthesis and field emission properties of flowerlike Sidoped AlN nanoneedle array," Applied Physics Letters 89,253112 (2006), 4 pages.

(56) References Cited

OTHER PUBLICATIONS

Kim, "Temperature-controlled growth and photoluminescence of AlN nanowires," Applied Surface Science 255 (2009), pp. 7221-7225.
Yu, "Evolution of aluminum nitride nanostructures from nanoflower to thin film on silicon substrate by direct nitridation of aluminum precursor," Diamond and Related Materials 16 (2007) pp. 1636-1642.
Lei, "Synthesis and optical property of high purity AlN nanowires," Materials Science and Engineering: B, vol. 143, No. 1-3, pp. 85-89, Oct. 2007.
Tang, "Synthesis of rectangular cross-section AlN nanofibers by chemical vapor deposition," Chemical Physics Letters 416, pp. 171-175, Nov. 2005.
Bertness, "Catalyst-Free Growth of GaN Nanowires," Apr. 2006, Journal of Electronic Materials, vol. 35, No. 4, pp. 576-580.
Chen, "Defect-related energy structures of AlN nanotips probed by photoluminescence," Journal of Physics D: Applied Physics, vol. 44, No. 50, p. 505304, Dec. 2011.
Zhang, "Vertically aligned one-dimensional AlN nanostructures on Conductive substrates: Synthesis and field emission," Vacuum, vol. 86, No. 7, pp. 833-837, Feb. 2012.
Qian et al., "Core/Multishell Nanowires Heterostructure as Multicolor, High-Efficiency Light-Emitting Diodes," Nano Letters 2005, vol. 5, No. 11, pp. 2287-2291.
Mohan et al., "Realiziation of Conductive InAs Nanotubes Based on Lattic-mismatched InP/InAs Core-shell Nanowires," Applied Physics Letters 88, 013110 (2006), pp. 013110-1 to 013110-3.
International Search Report for PCT application No. US2014061586, Jan. 26, 2015, 12 pages.
Japanese Application No. 2016-521970, Office Action1, Received Mar. 9, 2017, 2 pages (English translation is not available).
Jae Hyeon, K., Application No. 10-2016-7013605, Office Action (with English translation), May 22, 2017, 12 pages.
Japanese Application No. 2016-521970, Decision of Refusal, dated Aug. 1, 2017, 2 pages (English translation is not available).
Chinese Application No. 201480057571.7, Office Action1 (with English translation), dated Aug. 1, 2017, 18 pages.

\* cited by examiner

HETEROSTRUCTURE INCLUDING A COMPOSITE SEMICONDUCTOR LAYER

REFERENCE TO RELATED APPLICATIONS

The current application claims the benefit of U.S. Provisional Application No. 61/893,364, titled "Group III Nitride Semiconductor Composite Material and Device Containing the Same," which was filed on 21 Oct. 2013, and which is hereby incorporated by reference.

TECHNICAL FIELD

The disclosure relates generally to heterostructures for use in electronic and/or optoelectronic devices, and more particularly, to a heterostructure including a composite semiconductor layer.

BACKGROUND ART

One-dimensional group III nitride nanostructures, such as aluminum gallium nitride (AlGaN) or AlN nanostructures, have recently been investigated due to their unique physical properties for applications ranging from electronics to biomedical applications. For example, AlN nanowires have attracted particular attention due to their unique field emission properties, their electrical transport properties, as well as mechanical and piezoelectric properties. AlN nanowires have substantially different properties when compared to their bulk material counterparts, offering a potential for novel technological applications. Among the group III nitrides, AlN is a promising candidate for potential applications in nano-electronics due to its large energy band gap of 6.2 eV (i.e., the highest band gap among the group III nitrides) and low values of electron affinity. Other desirable properties of AlN include: high thermal and chemical stability, high thermal conductivity, high melting temperature, as well as low thermal expansion coefficients and good mechanical strength.

A wide range of AlN-based one dimensional (1D) nanostructures have been successfully synthesized recently, such as nano-whiskers, nanowires, nano-tubes, nano-needles, nano-cones, nano-fibers, and many others. There have been a number of different fabrication techniques used to synthesize AlN nanowires, including: a template-confined method, a direct current (DC) arc discharge method, a catalyst-assisted vapor-liquid-solid (VLS) growth method, as well as a catalyst-free vapor-solid (VS) growth method.

The template-confined method achieves formation of AlN nanowires through the use of template growth. Generally, the template-confined synthesis method is simple and provides a convenient way for bulk fabrication of AlN nanowires with uniform and controllable geometry. Materials, such as carbon nanotubes and anodic porous aluminum oxide, have been used to confine the formation of AlN nanowire within the nanometer scale. For example, AlN nanowires with controlled diameter have been successfully synthesized. These samples were fabricated through the reaction of carbon nanotubes, Al, and $Al_2O_3$ in a flowing $NH_3$ atmosphere. In this approach, Al powder of 200 mesh and $Al_2O_3$ powder of the same scale were mixed together in a 1:1 weight proportion. These, along with carbon nanotubes, served as the raw materials for producing the AlN nanowires. Anodic Aluminum Oxide (AAO) has also been explored as a template material for growth of AlN nanowires. Using an AAO template, hexagonal AlN nanowire arrays have been fabricated through the direct reaction of metal Al vapor with $NH_3/N_2$ at a temperature of 1100 Celsius under the confinement of an anodic porous alumina template. The synthesis mechanism was understood as the space-limited nucleation followed by the growth along the template channels.

The DC arc discharge method is a common technique used to synthesize 1D semiconductor nanostructures. One of the most notable advantages of this technique is that it enables fabrication of nanostructures with high crystal quality due to the high growth temperature and temperature gradient used. The successful synthesis of 1D AlN nanowires by the DC arc plasma method was recently reported. First, aluminum was melted in a $N_2$—Ar ambient through arc plasma discharge. Subsequently, under highly non-equilibrium conditions, the molten Al reacted with $N_2$ to produce crystalline cubic AlN (c-AlN) nanowires and nanoparticles. With an increased arc current, a simultaneous precipitation of c-AlN along with h-AlN phase was obtained.

The catalyst-assisted VLS growth method typically requires a metal for the formation of nanowires. The nanowire growth is characterized by a liquid-solid interface, where the synthesis of nanowire is accomplished through a liquid droplet. The growth sequence of the nanowires based on the VLS mechanism can be divided into three stages: (1) formation of the liquid-forming catalyst, (2) nucleation and growth of alloy droplets, and (3) growth of the nanowire from the liquid droplets due to super-saturation. The droplet is typically located at the end of the growing nanowire and serves as a region for the incorporation of aluminum and nitrogen for subsequent formation of the nanowire.

Finally, the catalyst-free VS growth method assumes the growth without the presence of any catalyst. This method is typically less complicated than the other growth approaches. In general, in a VS mechanism, the anisotropic growth of semiconductor nanowires is driven by several factors, such as the difference in the growth rates of various crystal facets. The VS growth process involves the use of aluminum and nitrogen as vapor precursors. The precursors are condensed onto a substrate. Due to the super-saturation of the vapor in gas phase, nucleation of the growth species on the substrate occurs. Eventually, with proper control of the experimental conditions, the desired semi-conductor nanowires can be successfully obtained. By employing a simple physical vapor deposition, highly ordered AlN nanowires have been successfully fabricated on a sapphire substrate. The resultant well-aligned nanowires had a uniform distribution in both their diameters and lengths. The nanowire diameter appeared to narrow toward the tip of the nanowire. The process of growth followed the steps of: producing an aluminum vapor reacting with $NH_3$ to form AlN on a sapphire substrate. The art of controlling desired AlN nanowire structure is difficult through a regular VS mechanism.

SUMMARY OF THE INVENTION

Aspects of the invention provide a heterostructure for use in an electronic or optoelectronic device, which includes one or more composite semiconductor layers. The composite semiconductor layer can include sub-layers of varying morphology, at least one of which can be formed by a group of columnar structures (e.g., nanowires). Another sub-layer in the composite semiconductor layer can be porous, continuous, or partially continuous.

A first aspect of the invention provides a heterostructure comprising: a composite semiconductor layer including a plurality of sub-layers, wherein the plurality of sub-layers includes: a first sub-layer comprising a plurality of columnar structures; and a second sub-layer immediately adjacent to the first sub-layer, wherein the second sub-layer is at least partially continuous.

A second aspect of the invention provides an optoelectronic device comprising: a sapphire substrate; and a buffer layer immediately adjacent to the sapphire substrate, wherein the buffer layer is formed of aluminum nitride and includes a plurality of sub-layers, wherein the plurality of sub-layers includes: a first sub-layer comprising a plurality of columnar structures; and a second sub-layer immediately adjacent to the first sub-layer, wherein the second sub-layer is at least partially continuous.

A third aspect of the invention provides a method comprising: growing a composite semiconductor layer including a plurality of sub-layers, wherein the plurality of sub-layers includes: a first sub-layer comprising a plurality of columnar structures; and a second sub-layer immediately adjacent to the first sub-layer, wherein the second sub-layer is at least partially continuous.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a heterostructure for use in an electronic or optoelectronic device, which includes one or more composite semiconductor layers. The composite semiconductor layer can include sub-layers of varying morphology, at least one of which can be formed by a group of columnar structures (e.g., nanowires). Another sub-layer in the composite semiconductor layer can be porous, continuous, or partially continuous. The composite semiconductor layer can be configured to reduce stresses within the heterostructure, reduce threading dislocations in subsequently grown epitaxial layers, improve light extraction, and/or the like, thereby improving mechanical, electrical, and/or light emitting properties of the corresponding device.

As used herein, unless otherwise noted, the term "set" means one or more (i.e., at least one) and the phrase "any solution" means any now known or later developed solution. As also used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength+/−five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/−one percent). It is understood that, unless otherwise specified, each value is approximate and each range of values included herein is inclusive of the end values defining the range.

Figure 1:
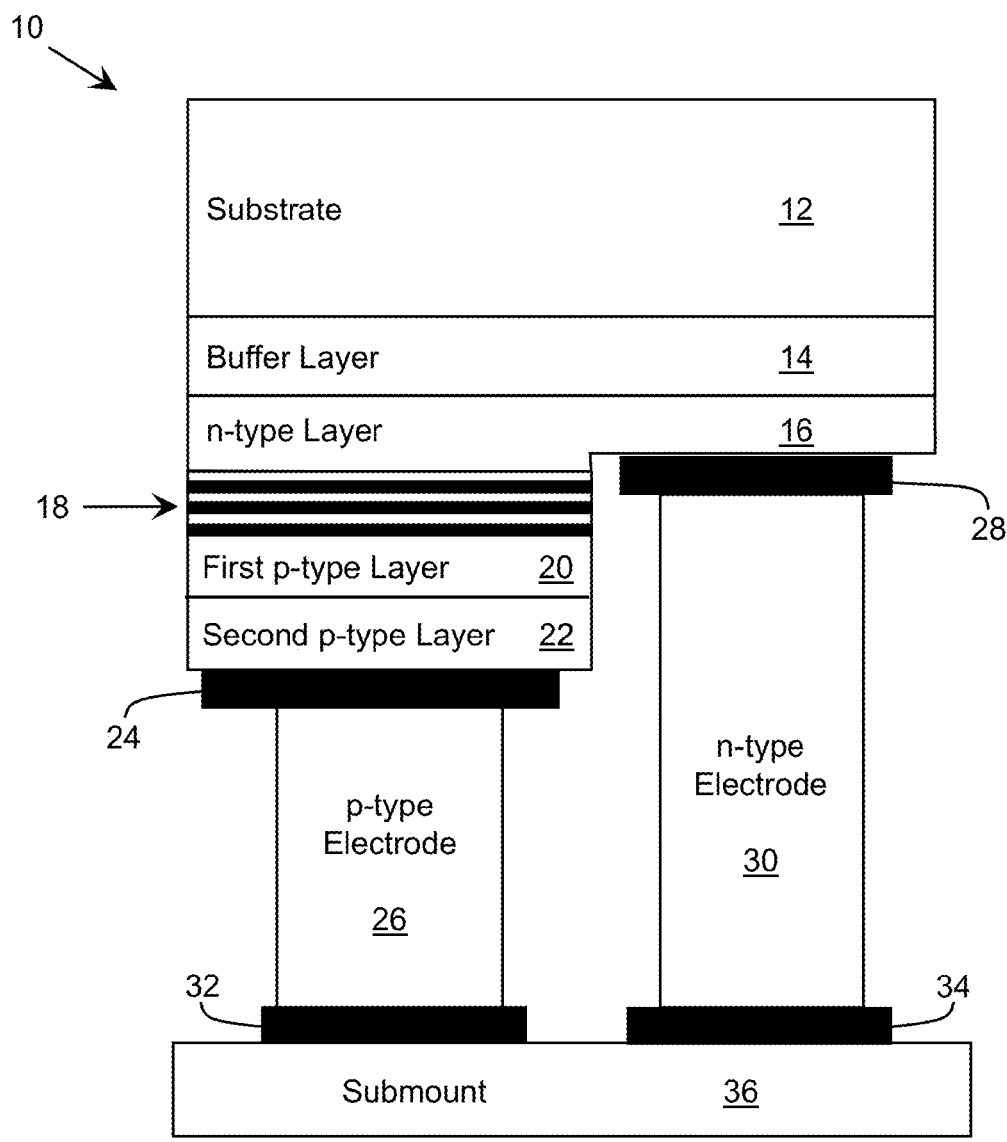
FIG. 1 shows a schematic structure of an illustrative optoelectronic device according to an embodiment.

Aspects of the invention provide a heterostructure that can be incorporated into an optoelectronic device, such as a conventional or super luminescent light emitting diode, a light emitting laser, a laser diode, a light/photo sensor, a photodetector, a photodiode, an avalanche diode, and/or the like. Turning to the drawings, FIG. 1 shows a schematic structure of an illustrative optoelectronic device 10 according to an embodiment. In a more particular embodiment, the optoelectronic device 10 is configured to operate as an emitting device, such as a light emitting diode (LED) or a laser diode (LD). In either case, during operation of the optoelectronic device 10, application of a bias comparable to the band gap results in the emission of electromagnetic radiation from an active region 18 of the optoelectronic device 10. The electromagnetic radiation emitted (or sensed) by the optoelectronic device 10 can have a peak wavelength within any range of wavelengths, including visible light, ultraviolet radiation, deep ultraviolet radiation, infrared light, and/or the like. In an embodiment, the device 10 is configured to emit (or sense) radiation having a dominant wavelength within the ultraviolet range of wavelengths. In a more specific embodiment, the dominant wavelength is within a range of wavelengths between approximately 210 and approximately 360 nanometers.

The optoelectronic device 10 includes a heterostructure 11 comprising a substrate 12, a buffer layer 14 adjacent to the substrate 12, an n-type layer 16 (e.g., a cladding layer, electron supply layer, contact layer, and/or the like) adjacent to the buffer layer 14, and an active region 18 having an n-type side adjacent to the n-type layer 16. Furthermore, the heterostructure 11 of the optoelectronic device 10 includes a first p-type layer 20 (e.g., an electron blocking layer, a cladding layer, hole supply layer, and/or the like) adjacent to a p-type side of the active region 18 and a second p-type layer 22 (e.g., a cladding layer, hole supply layer, contact layer, and/or the like) adjacent to the first p-type layer 20.

In a more particular illustrative embodiment, the optoelectronic device 10 is a group III-V materials based device, in which some or all of the various layers are formed of elements selected from the group III-V materials system. In a still more particular illustrative embodiment, the various layers of the optoelectronic device 10 are formed of group III nitride based materials. Group III nitride materials comprise one or more group III elements (e.g., boron (B), aluminum (Al), gallium (Ga), and indium (In)) and nitrogen (N), such that $B_wAl_xGa_yIn_zN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based optoelectronic device 10 includes an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, the n-type layer 16, the first p-type layer 20, and the second p-type layer 22 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, 20, and 22. When the optoelectronic device 10 is configured to be operated in a flip chip configuration, such as shown in FIG. 1, the substrate 12 and buffer layer 14 should be transparent to the target electromagnetic radiation. To this extent, an embodiment of the substrate 12 is formed of sapphire, and the buffer layer 14 can be composed of AlN, an AlGaN/AlN superlattice, and/or the like. However, it is understood that the substrate 12 can be formed of any suitable material including, for example, silicon carbide (SiC), silicon (Si), bulk GaN, bulk AlN, bulk or a film of AlGaN, bulk or a film of BN, AlON, $LiGaO_2$, $LiAlO_2$, aluminum oxinitride ($AlO_xN_y$), $MgAl_2O_4$, GaAs, Ge, or another suitable material. Furthermore, a surface of the substrate 12 can be substantially flat or patterned using any solution.

The optoelectronic device 10 can further include a p-type contact 24, which can form an ohmic contact to the second p-type layer 22, and a p-type electrode 26 can be attached to the p-type contact 24. Similarly, the optoelectronic device 10 can include an n-type contact 28, which can form an ohmic contact to the n-type layer 16, and an n-type electrode 30 can be attached to the n-type contact 28. The p-type contact 24 and the n-type contact 28 can form ohmic contacts to the corresponding layers 22, 16, respectively.

In an embodiment, the p-type contact 24 and the n-type contact 28 each comprise several conductive and reflective metal layers, while the n-type electrode 30 and the p-type electrode 26 each comprise highly conductive metal. In an embodiment, the second p-type layer 22 and/or the p-type electrode 26 can be transparent to the electromagnetic radiation generated by the active region 18. For example, the second p-type layer 22 and/or the p-type electrode 26 can comprise a short period superlattice lattice structure, such as an at least partially transparent magnesium (Mg)-doped AlGaN/AlGaN short period superlattice structure (SPSL). Furthermore, the p-type electrode 26 and/or the n-type electrode 30 can be reflective of the electromagnetic radiation generated by the active region 18. In another embodiment, the n-type layer 16 and/or the n-type electrode 30 can be formed of a short period superlattice, such as an AlGaN SPSL, which is transparent to the electromagnetic radiation generated by the active region 18.

As further shown with respect to the optoelectronic device 10, the device 10 can be mounted to a submount 36 via the electrodes 26, 30 in a flip chip configuration. In this case, the substrate 12 is located on the top of the optoelectronic device 10. To this extent, the p-type electrode 26 and the n-type electrode 30 can both be attached to a submount 36 via contact pads 32, 34, respectively. The submount 36 can be formed of aluminum nitride (AlN), silicon carbide (SiC), and/or the like.

In an embodiment, one or more of the semiconductor layers in the heterostructure for the device 10 is formed of a composite semiconductor material, which can be configured to promote low stress, lattice-matched epitaxial growth of semiconductor layer(s), and/or the like. In a more particular embodiment, the buffer layer 14 is formed of such a composite semiconductor material. The buffer layer 14 can be grown over a suitable substrate 12, such as sapphire, and provide a substrate for subsequent epitaxial growth of additional semiconductor layers in the heterostructure for the device 10 thereon. Regardless, the composite semiconductor material can include at least two semiconductor sub-layers, each having a distinctly different morphology. Inclusion of one or more of such composite layers can improve an efficiency with which the electronic device operates.

Figure 2A:
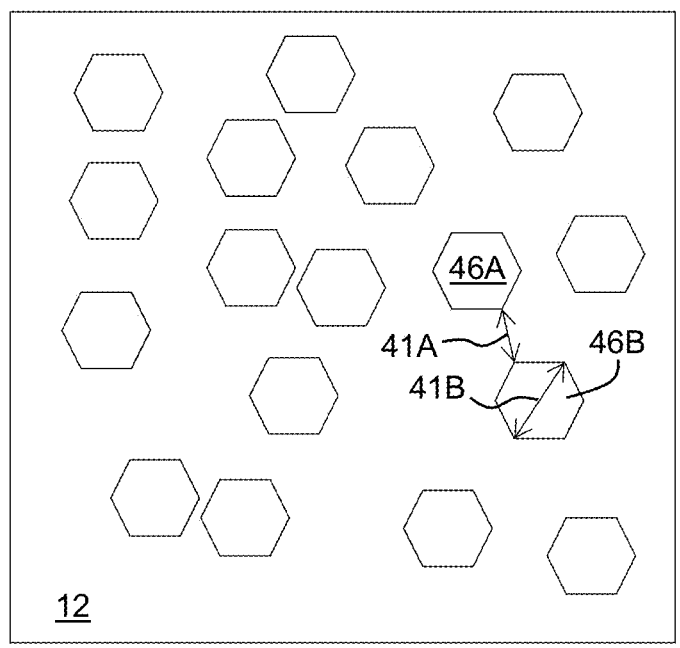
FIGS. 2A and 2B show top and side views, respectively, of an illustrative group of columnar structures according to an embodiment.
Figure 2B:
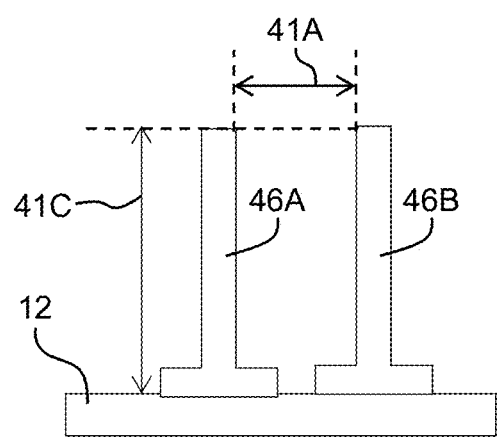

In an illustrative embodiment, one of the sub-layers of the composite semiconductor layer includes three-dimensional columnar structures (e.g., nanowires) separated from each other by gaps, which can comprise air. For example, FIGS. 2A and 2B show top and side views, respectively, of an illustrative group of columnar structures 46A-46B according to an embodiment. As discussed herein, the columnar structures 46A-46B can be grown on a lower layer, such as the substrate 12, using any solution. In any event, the columnar structures 46A-46B formed on an adjacent layer (e.g., the substrate 12) can have a characteristic spacing 41A (e.g., gap width), a characteristic diameter 41B, and a characteristic length 41C. While the characteristic dimensions 41A-41C are illustrated for a single pair of columnar structures 46A-46B, it is understood that each characteristic dimension 41A-41C for a given group of columnar structures 46A-46B is calculated considering all or some statistically relevant portion of all of the columnar structures 46A-46B (e.g., a random sample having a sufficient sample size). For example, each characteristic dimension 41A-41C can correspond to an average dimension of the columnar structures 46A-46B. While the columnar structures 46A-46B are shown having hexagonal lateral cross-sections, it is understood that this is only illustrative and the columnar structures 46A-46B can have any of various cross-sections.

As illustrated, an embodiment of the columnar structures can exhibit a high ratio (e.g., greater than five or greater than ten in a more specific embodiment) of characteristic length 41C versus characteristic diameter 41B. In a more particular embodiment, the characteristic spacing 41A for the columnar structures 46A-46B is in a range of two to one hundred nanometers, the characteristic diameter 41B for the columnar structures 46A-46B is in a range of ten to five hundred nanometers, and the characteristic length 41C is in a range of fifty nanometers to five microns.

Figure 3:
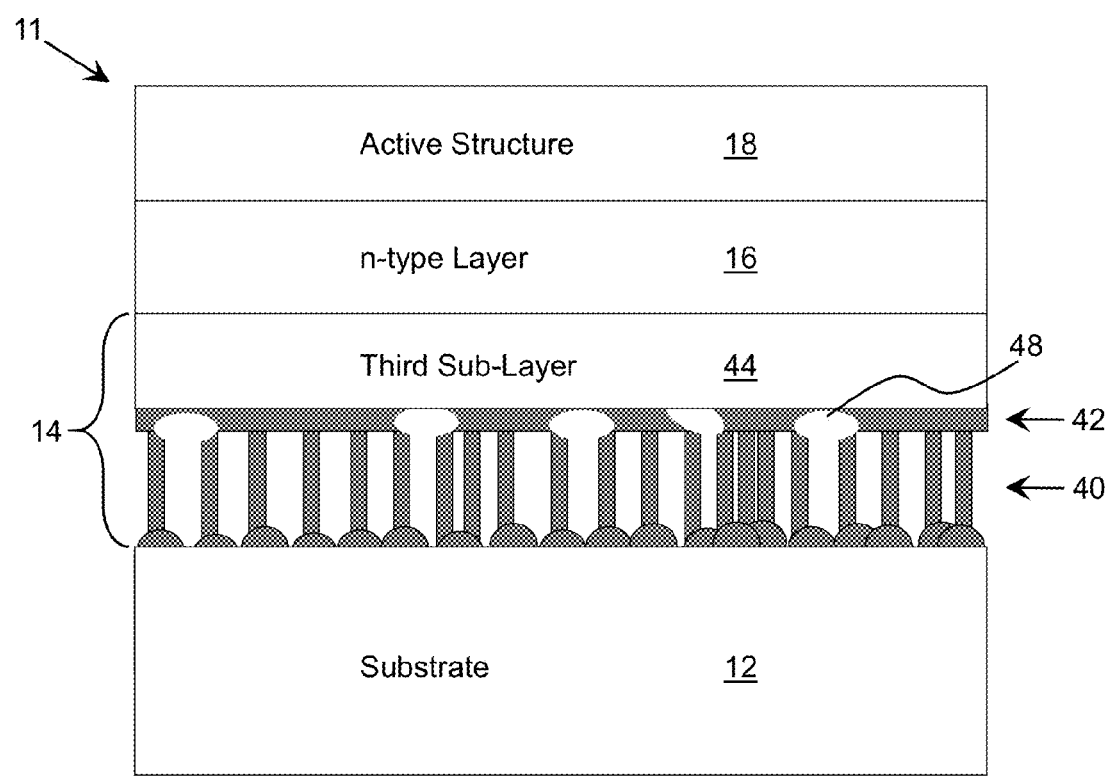
FIG. 3 shows a schematic view of an illustrative heterostructure according to an embodiment.

A composite semiconductor layer described herein can further include one or more sub-layers epitaxially grown on the columnar structures 46A-46B. To this extent, FIG. 3 shows a schematic view of an illustrative heterostructure 11 according to an embodiment. In this case, the heterostructure includes a substrate 12 on which a composite buffer layer 14 is formed. The buffer layer 14 includes a first sub-layer 40 comprising a plurality of columnar structures, which can be configured as described herein. Additionally, the buffer layer 14 includes a second sub-layer 42, which can be grown on the first sub-layer 40 (e.g., to a height of at least 200 nm) and be at least partially continuous (e.g., the second sub-layer fills at least fifty percent of the lateral area). To this extent, the second sub-layer 42 can physically connect at least some of the columnar structures of the first sub-layer 40. However, the second sub-layer 42 can include various cavities 48 therein. In an embodiment, the cavities 48 can be continuous or isolated, and have a characteristic width in a range of 1-500 nm, a characteristic height in a range of 10 nm to 5 μm, and a volumetric density within a cavity containing layer of at least 0.1 percent. The cavities 48 can provide stress reduction in the corresponding sub-layer 42.

The composite buffer layer 14 also can include a third sub-layer 44, which can be a superlattice, epitaxially grown on the second sub-layer 42. The third sub-layer 44 can be an essentially continuous semiconductor layer containing at most ten percent voids (i.e., at least ninety percent of the lateral area is covered by the essentially continuous sub-layer 44). The composite buffer layer 14 can be configured to provide a surface on which various additional layers of the heterostructure 11 can be epitaxially grown, including the n-type layer 16, the active structure 18, and/or the like. To this extent, the first sub-layer 40 can be configured to decrease a number of threading dislocations at the top of the composite buffer layer 14 than would be present using a prior art growth approach.

In a still more particular embodiment, the buffer layer 14, and subsequent semiconductor layers 16, 18, are formed of group III nitride materials. To this extent, each sub-layer 40, 42, 44 of the buffer layer 14 can be formed of any type of group III nitride semiconductor alloy, $B_wAl_xGa_yIn_zN$, where $0 \leq W, X, Y, Z \leq 1$, and $W+X+Y+Z=1$. The composition of each sub-layer 40, 42, 44 can be similar or different from one or both of the other sub-layers 40, 42, 44. In an illustrative embodiment, the first sub-layer 40 includes columnar structures formed of AlN, which is a material having a low absorption to radiation in the ultraviolet wavelength range.

Figure 4A:
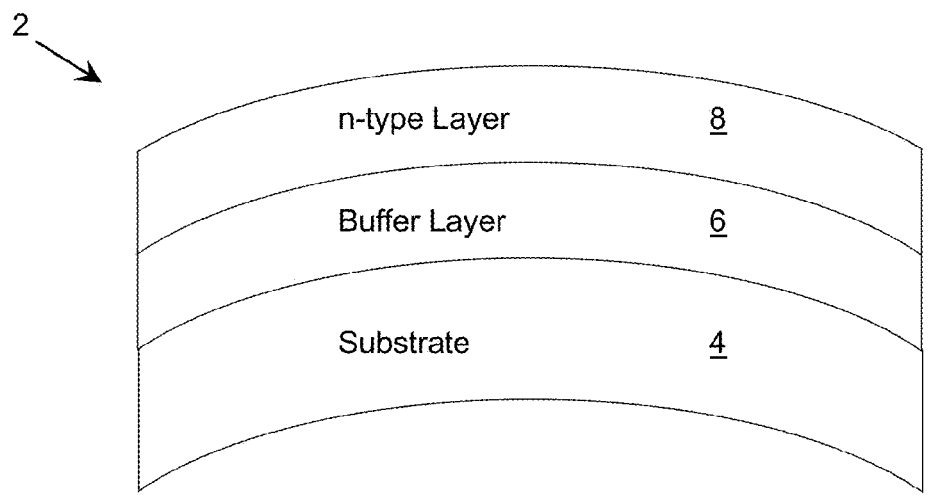
FIGS. 4A and 4B compare a nominal heterostructure with an embodiment of a heterostructure described herein.
Figure 4B:
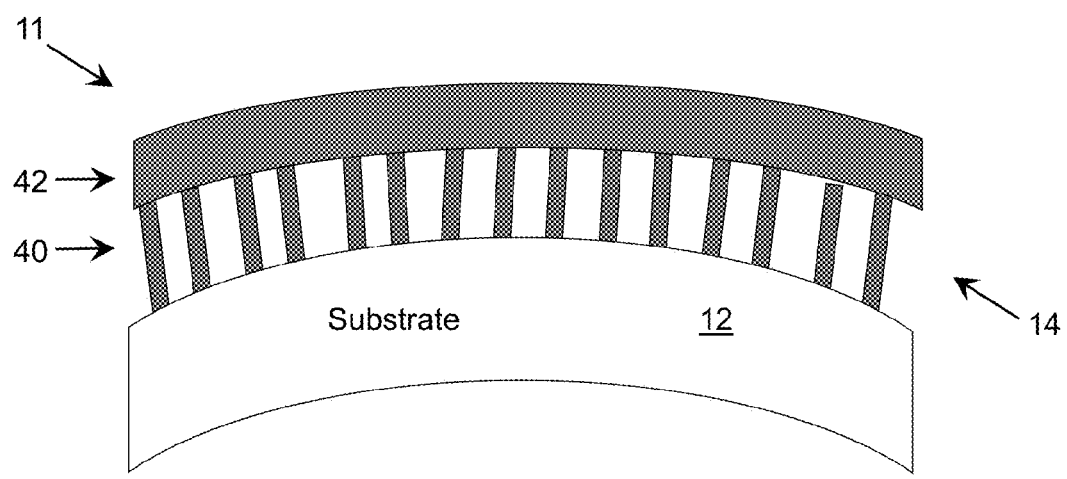

An embodiment provides a heterostructure 11 for a device having a reduced curvature due to wafer bowing. For example, FIGS. 4A and 4B compare a nominal heterostructure 2 with an embodiment of a heterostructure 11 described herein. As shown in FIG. 4A, in the heterostructure 2, a curvature of a substrate 4 is generally carried forward to a top surface of a buffer layer 6 grown thereon, and a top surface of an n-type layer 8 grown on the buffer layer 6. For example, fabrication of the heterostructure 2 for use in a deep ultraviolet light emitting diode (DUV LED) can include epitaxial growth of an AlN buffer layer 6 over a sapphire substrate 4. Subsequent layers, such as the n-type layer 8, can be grown on the buffer layer 6 and can include a substantial fraction of gallium (e.g., AlGaN layers). For a current state of the art DUV LED, these layers are grown at temperatures of about 1200 C, with a growth rate of about a few microns per hour. The threading dislocation density of typical AlN on sapphire can be as large as $10^{10}$ cm$^{-2}$ when no special techniques are used. This density is about two orders of magnitude higher than needed for fabricating an efficient device.

One technique to reduce threading dislocation density includes three-dimensional growth of the buffer layer 6. In this approach, through coalescence of AlN nucleation islands, an initial nucleation layer contains a rough surface. By introducing a high-growth-rate pulsed-flow mode, the surface morphology can be significantly improved. One typical approach comprises growth of an AlN nucleation layer at about 10-100 Torr at temperatures of 600-1100 C with an average V/III ratio on the order of a 10000, with possibly a preferred temperature range between 800-900 C. Furthermore, through migration enhanced epitaxy used to promote coalescence of nucleation islands, the $NH_3$ is added through a pulsed flow growth at about 100 Torr and temperatures of about 1200 C with a V/III ratio of about 2000. The last step of high growth rate relates to a growth technology that will be referred as two-dimensional as it results in smoother two-dimensional continuous semiconductor film. The pulse of $NH_3$ lasts for few seconds. The process of 3-dimensional growth of nucleation layer followed by 2-dimensional growth can be repeated several times to minimize the presence of threading dislocations. Such a growth process results in a semiconductor AlN buffer layer 6 referred to herein as a nominal buffer layer. The nominal buffer layer results in a dislocation density reduced by one or one and a half orders of magnitude.

In contrast, an embodiment of the buffer layer 14 described herein can provide stress reduction combined with reduction in threading dislocation density. For example, as shown in FIG. 4B, formation of a first sub-layer 40 including the columnar structures can result in a top surface of a second sub-layer 42 having significantly less (e.g., at least five percent less) curvature than that of the substrate 12 on which the first sub-layer 40 is grown. The lower bowing present in the second sub-layer 42 of the heterostructure 11 can result, for example, in stresses that are significantly lower than the stresses present in the heterostructure 2. In an embodiment, the stresses present in the heterostructure 11 are at least five (e.g., ten in a more particular embodiment) percent less than those present in the heterostructure 2 as can be attested from measurement of the bowing of the substrate wafer. Similarly, a lattice constant of the top group III nitride semiconductor layer 42 more closely matches the lattice constant of a relaxed layer of the same composition as evident from the x-ray diffraction measurements. In an embodiment, the lattice mismatch present in the heterostructure 11 is at least five (e.g., ten in a more particular embodiment) percent less than the lattice mismatch present in the heterostructure 2. Similarly, the heterostructure 11 can have one or more additional properties that are reduced by at least five (e.g., ten in a more particular embodiment) percent as compared to the properties of the heterostructure 2. Such properties can include, for example, an effective biaxial elastic modulus, an effective Young's modulus, and/or the like.

The three-dimensional columnar structures of the first sub-layer 40 can be formed using any solution. In an embodiment, the columnar structures are grown on an underlying layer (e.g., the substrate 12) using a process in which group III nitride semiconductor islands are first formed, followed by epitaxial growth of the columnar, rod-like structures over the islands. Further changes to the growth process can result in formation of the second sub-layer 42, which is at least partially continuous and connects at least some of the columnar structures in the first sub-layer 40.

Figure 5:
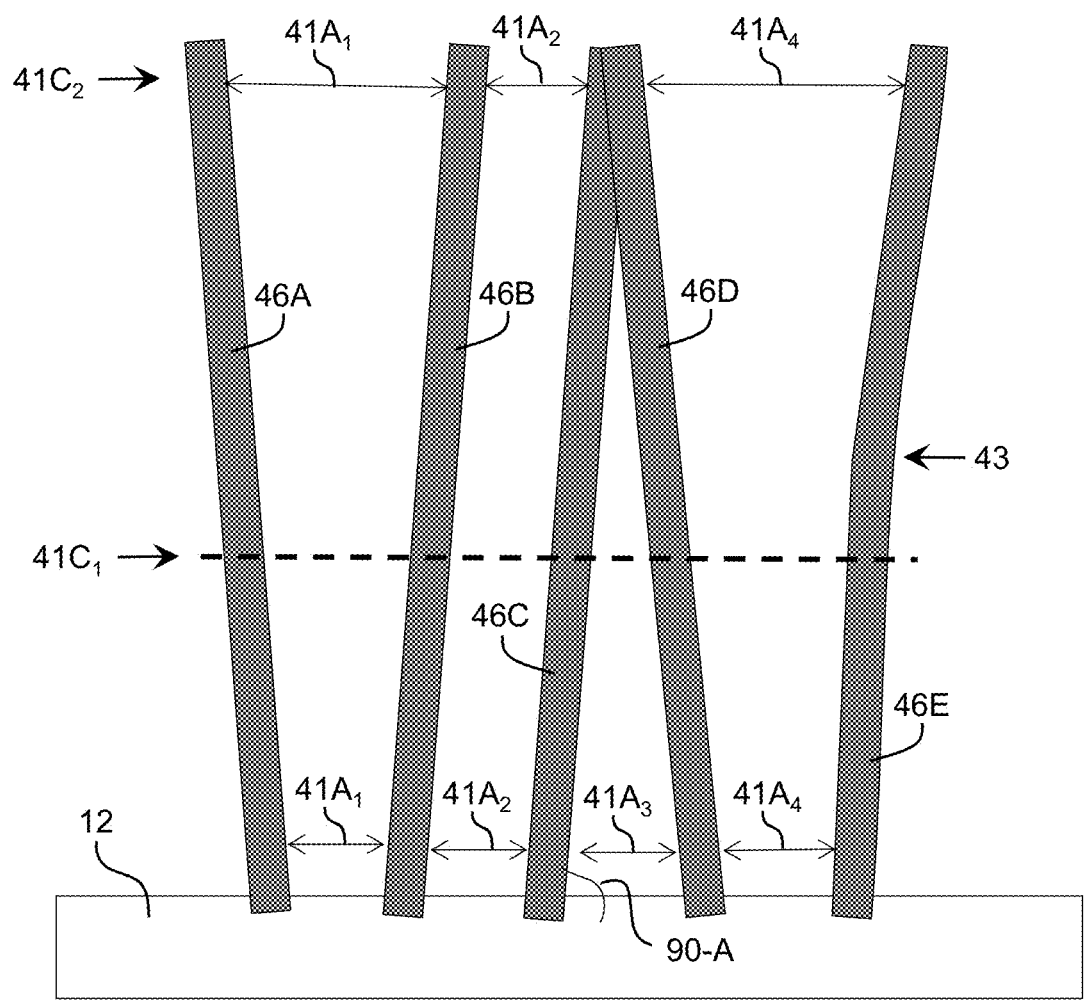
FIG. 5 shows illustrative columnar structures according to an embodiment.

In an embodiment, an aspect ratio of the three-dimensional columnar structures of the first sub-layer 40 can be configured to reduce the number of threading dislocations without significantly sacrificing alignment of the three-dimensional columnar structures. FIG. 5 shows illustrative columnar structures 46A-46E according to an embodiment. Initially, using the growth process described above, an island corresponding to each columnar structure 46A-46E can be formed on the surface of the substrate 12. The formation of the islands corresponding to the columnar structures 46A-46E can be configured to provide a relatively low variance (e.g., +/−100% or less) in the separations $41A_{1-4}$ between the resulting columnar structures 46A-46E near the surface of the substrate 12 (e.g., $41A_1 \approx 41A_2 \approx 41A_3 \approx 41A_4$).

During growth of the columnar structures 46A-46E on a surface of a lattice mismatched substrate 12, the columnar structures 46A-46E can have an inclination angle A which is not normal to the surface of the substrate 12. To this extent, at least some of the columnar structures 46A-46E can be tilted with respect to the normal of the surface of the substrate 12 and with respect to each other. In this case, as growth of the columnar structures 46A-46E continues to a length $41C_2$, variation in the separations $41A_{1-4}$ increases and two or more of the columnar structures, such as the columnar structures 46C, 46D, can coalesce. Such a high variation can be detrimental to subsequent growth of the at least partially continuous second sub-layer 42.

In an embodiment, coalescence of the columnar structures 46A-46E (e.g., due to tilt) can be avoided to prevent formation of a significant number of dislocations at the regions of grain boundaries, e.g., by interrupting growth of the columnar structures 46A-46E prior to such natural coalescence. However, an embodiment of the columnar structures 46A-46E can have a high ratio of characteristic length 41C versus characteristic diameter 41B. To this extent, growth of the columnar structures 46A-46E can be optimized based on the tilt angle A of the columnar structures 46A-46E. It is understood that the tilt angle A for a given columnar structure can vary during growth of the structure. For example, as illustrated in conjunction with columnar structure 46E, the structure can include one or more bends 43. In this case, an effective tilt angle A of the columnar structure 46E can be calculated using any solution, e.g., as an average tilt of the columnar structure 46E.

Considering the columnar structures 46C, 46D, a distance $41A_3$ between these two columnar structures 46C, 46D can be calculated as a function of height, H, using the formula:

$$D(H) = d_{CD} - H\left(\frac{1}{\tan(90 - A_C)} + \frac{1}{\tan(90 - A_D)}\right),$$

where $d_{CD}$ is the distance between the islands for the columnar structures 46C, 46D located on the surface of the substrate 12, and $A_C$, $A_D$ are the inclination angles (measured from the normal to the surface) for the columnar structures 46C, 46D, respectively. In general, the inclination angles $A_C$, $A_D$ can be assumed to be approximately the same angle, $\Theta$. Using a characteristic island separation distance, d, the distance between two columnar structures in the first sub-layer 40 (FIG. 4B) can be calculated as:

$$D(H) = d - 2H/\tan(90-\theta),$$

for converging columns, and $$D(H) = d + 2H/\tan(90-\theta)$$

for diverging columns. To this extent, variation in the separation distances between various columnar structures 46A-46E in the first sub-layer 40 at a given height, H, can be as much as $4H/\tan(90-\theta)$, which corresponds to the maximum separation distance between two columnar structures 46A-46E.

In an embodiment, growth of the columnar structures 46A-46E uses an optimization parameter requiring growth to be stopped at a total length 41C (FIG. 2B), at which variation in the separation distances between the columnar structures 46A-46E does not exceed ten percent of the original characteristic separation value, d, for the columnar structures 46A-46E, e.g., $4H/\tan(90-\theta)<0.1$ d. It is understood that an average variation in separation distances is smaller. As a result, limiting maximum variation in separation distance corresponds to a more limiting and conservative criteria. In a more particular embodiment, the maximum variation in separation distances is less than five percent of the original characteristic separation value.

A total length 41C of the columnar structures 46A-46E is limited by a given tilt angle $\theta$ and island separation d. For example, for an effective tilt angle of ten degrees and a requirement that the separation distance between columnar structures 46A-46E not exceed ten percent of the original separation value, the total length 41C of the columnar structures 46A-46E in the sub-layer 40 is limited to $0.1 \times \tan(80°)/4$, which is fourteen percent of the separation distance, d, between the islands. For a tilt angle of one degree, the total length 41C can be much higher, as much as 143% of the separation distance. In an embodiment, the islands can have a characteristic size in a range of 10-500 nanometers and a characteristic separation 41A (FIGS. 2A, 2B) between 2-100 nanometers. For a separation distance of 100 nm, this translates into a total length 41C of 143 nm for a tilt of one degree, and a total length 41C of 14 nm for a tilt of ten degrees. In general, the tilt of the columnar structures 46A-46E depends on the growth conditions, but typically is no more than a few (e.g., up to five) degrees.

In an embodiment, growth of the columnar structures 46A-46E uses an optimization parameter that requires growth to continue for a minimum total length 41C. To this extent, a minimum total length 41C can be calculated using a characteristic diameter 41B (FIG. 2A) of the columnar structures 46A-46E and a requirement to reduce dislocations. For example, dislocation bending under typical stresses associated with AlN/sapphire lattice mismatch can be a few degrees. Considering an illustrative average dislocation bending of $\theta$ degrees, a height-to-diameter ratio of the columnar structure 46A-46E should be approximately (and conservatively) equal to $\tan(90-\theta)$. Using a more particular example, for dislocation bending by five degrees, the height-to-diameter ratio should be about twelve. For columnar structures 46A-46E having a characteristic diameter 41B of 20 nm, the total length 41C of the columnar structures 46A-46E should be at least a few hundreds of nanometers.

Figure 6A:
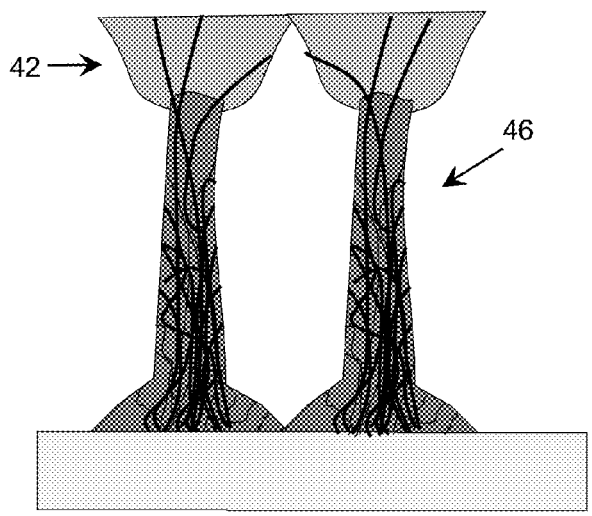
FIGS. 6A and 6B show illustrative columnar structures according to embodiments.
Figure 6B:
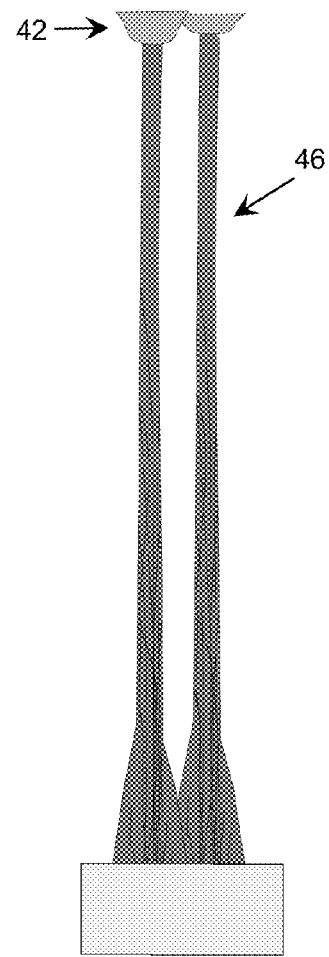

FIGS. 6A and 6B show illustrative columnar structures 46 according to embodiments. The columnar structures 46 shown in FIG. 6A have a lower height-to-diameter ratio than the columnar structures 46 shown in FIG. 6B. In both cases, the columnar structures 46 provide a significant reduction in a number of dislocations (indicated by black lines) that are present in the at least partially continuous second sub-layer 42 as compared to the number of dislocations present at the opposing end of the columnar structures 46. As illustrated by the columnar structures 46 shown in FIG. 6A, a height-to-diameter ratio of the columnar structures 46 may be selected such that some dislocations are still present in the second sub-layer 42. Alternatively, as illustrated by the columnar structures 46 shown in FIG. 6B, the columnar structures 46 can have a height-to-diameter ratio that causes substantially all of the dislocations to turn prior to the second sub-layer 42. In an embodiment, the columnar structures 46 are configured to reduce a threading dislocation density by at least a factor of ten.

Figure 7:
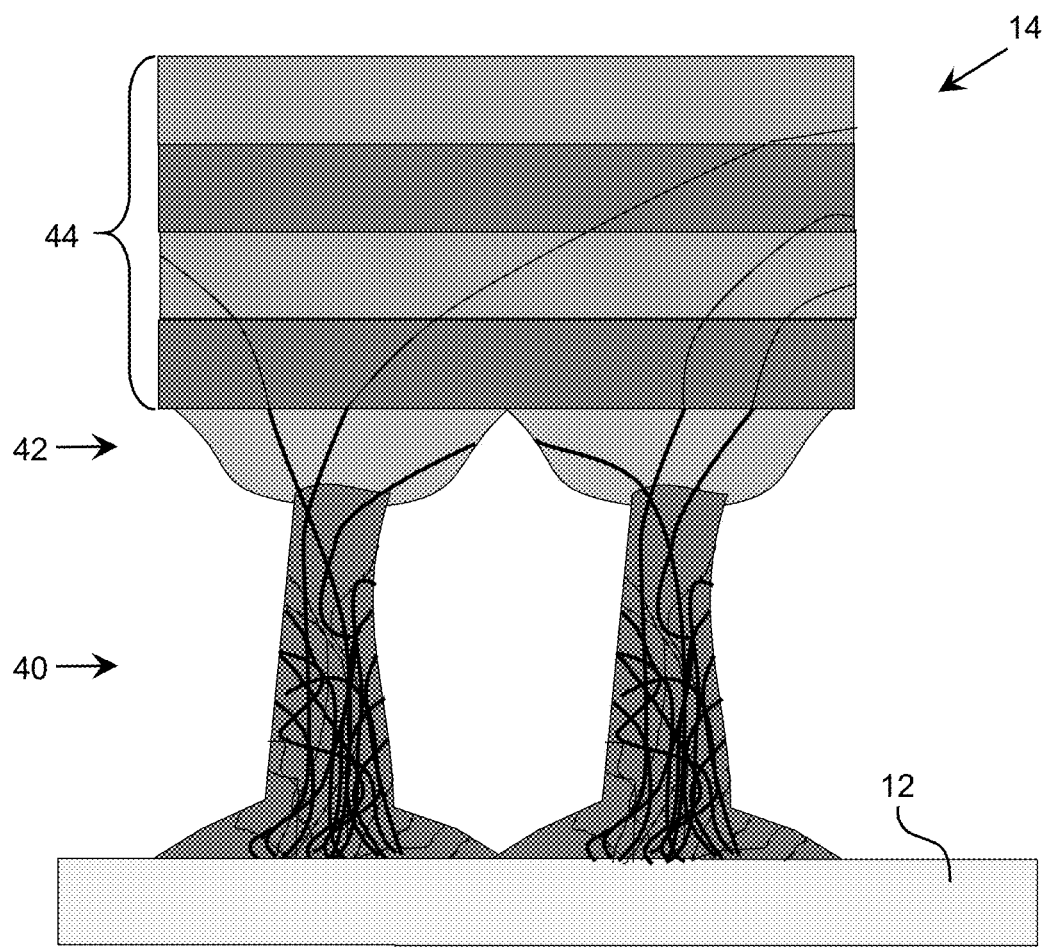
FIG. 7 shows an illustrative composite semiconductor layer according to an embodiment.

In an embodiment, one or more additional sub-layers of a composite semiconductor layer are configured to facilitate bending of threading dislocations. For example, FIG. 7 shows an illustrative composite semiconductor layer 14 (e.g., a buffer layer) according to an embodiment. As illustrated, the first sub-layer 40 can include columnar structures 46, which significantly reduce a number of threading dislocations (black lines) propagating from a lower layer 12 (e.g., a substrate) through the composite semiconductor layer 14. Some threading dislocations present in the at least partially continuous second sub-layer 42 of the composite semiconductor layer 14 also will be sufficiently bent to terminate at an edge present in the second sub-layer 42. Additionally, the third sub-layer 44 can be configured to bend dislocations continuing through the second sub-layer 42. For example, the third sub-layer 44 can comprise a superlattice including a plurality of alternating tensile and compressive layers configured to induce sufficient stresses to induce dislocation bending. In an illustrative embodiment, the superlattice includes AlN layers and alternating with $Al_xGa_{1-x}N$ layers, such that $0.1<x<0.8$, with layer thicknesses less than 100 nm. In another illustrative embodiment, the superlattice includes tensile layers of $Al_uGa_{1-u}N$ and compressive layers of $Al_tGa_{1-t}N$ epitaxially grown such that the tensile layers have a lattice mismatch with the compressive layers of at least 0.1%, each layer has a thickness between 5-5000 nm, and $0.3 \le u \le 1$, $0.1 \le t \le 1$.

Figure 8A:
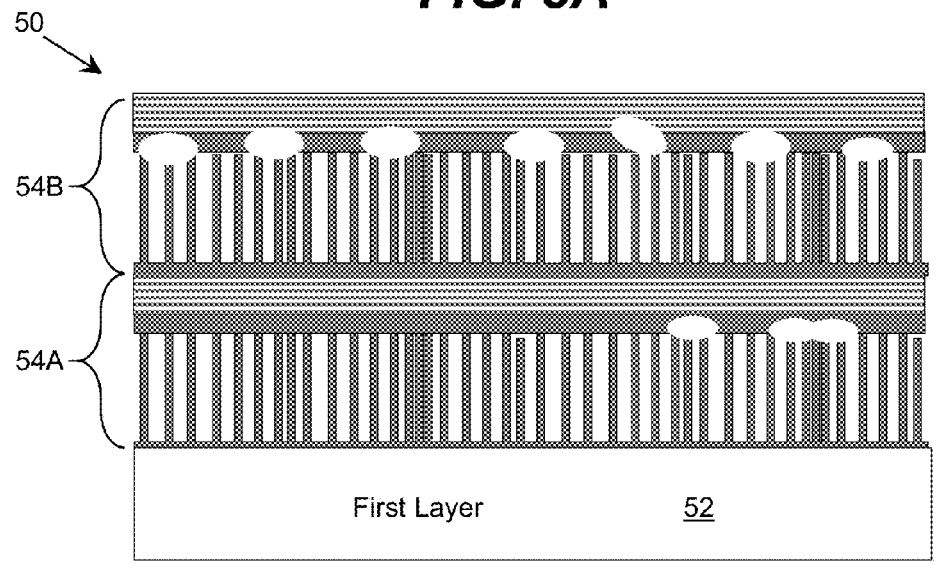
FIGS. 8A and 8B show illustrative heterostructures according to embodiments.
Figure 8B:
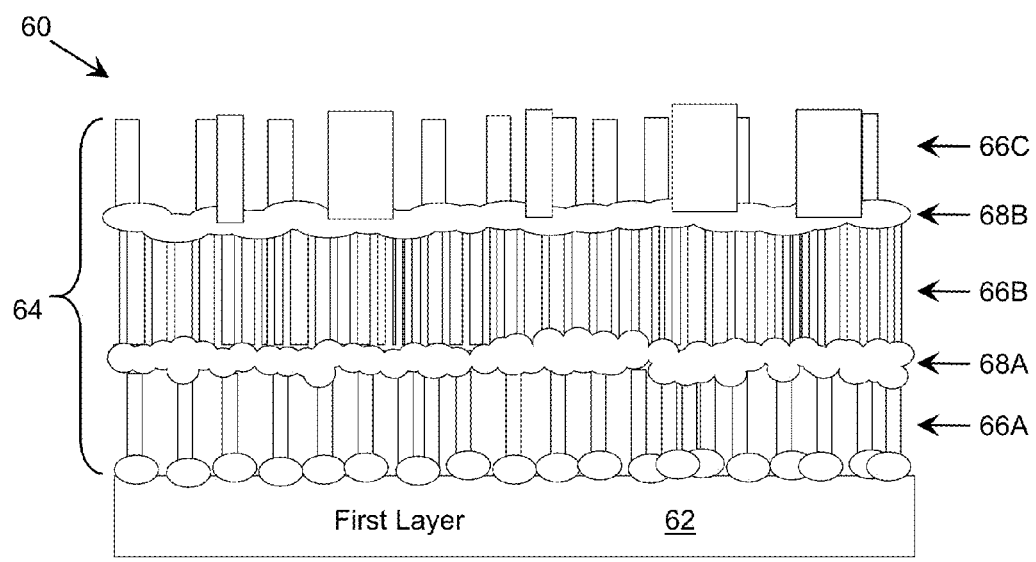

While illustrative aspects of a composite semiconductor layer have been shown and described primarily in conjunction with a buffer layer 14 grown on a substrate 12, it is understood that a heterostructure described herein can include any number of one or more composite semiconductor layers, one of which may or may not be the buffer layer 14, located in any portion of the heterostructure. To this extent, FIGS. 8A and 8B show illustrative heterostructures 50, 60, respectively, each of which includes multiple sub-layers formed of columnar structures according to embodiments. In FIG. 8A, the heterostructure 50 includes a first layer 52 on which a first composite semiconductor layer 54A is grown. A second composite semiconductor layer 54B can be grown over the first composite semiconductor layer 54A. As illustrated, each composite semiconductor layer 54A, 54B can include, for example, a sub-layer formed of columnar structures, an at least partially continuous sub-layer, and/or an essentially continuous sub-layer, as described herein.

It is understood that when a heterostructure 50 includes multiple composite semiconductor layers 54A, 54B, a sub-layer of columnar structures for each composite semiconductor layer 54A, 54B can have the same or different characteristic dimensions (e.g., diameters, lengths, separation, and/or the like). In an illustrative embodiment, a first composite semiconductor layer 54A can include a sub-layer of columnar structures which have a large characteristic diameter and a high characteristic length-to-diameter ratio, while each subsequent composite semiconductor layer 54B can include a sub-layer of columnar structures which have a low characteristic diameter and a smaller characteristic length-to-diameter ratio. For example, the characteristic diameter of the columnar structures in the composite semiconductor layer 54B may be as much as fifty percent smaller than the characteristic diameter of the columnar structures in the composite semiconductor layer 54A. Changes in the characteristic length-to-diameter ratio between the composite semiconductor layers 54A and 54B can be as much as ±80%. Such a configuration of the composite semiconductor layers 54A, 54B can improve the reduction of dislocations and stress in the heterostructure 50.

Similarly, a composite semiconductor layer described herein can include multiple sub-layers formed of columnar structures. For example, FIG. 8B shows an illustrative heterostructure 60, which includes a first layer 62 on which a composite semiconductor layer 64 (e.g., an AlN nanowire layer) is formed. The composite semiconductor layer 64 can comprise a superlattice, which includes multiple sub-layers 66A-66C formed of columnar structures, which alternate with at least partially continuous sub-layers 68A, 68B. As illustrated, the columnar structures of each sub-layer 66A-66C can have one or more characteristic dimensions (e.g., diameters, lengths, separation, and/or the like) that differ from the corresponding characteristic dimension(s) of a neighboring sub-layer 66A-66C by at least one percent. For example, in this case, the intermediate sub-layer 66B is shown having columnar structures with a relatively small characteristic diameter and a relatively small characteristic separation as compared to the columnar structures of the other sub-layers 66A, 66C.

Figure 9:
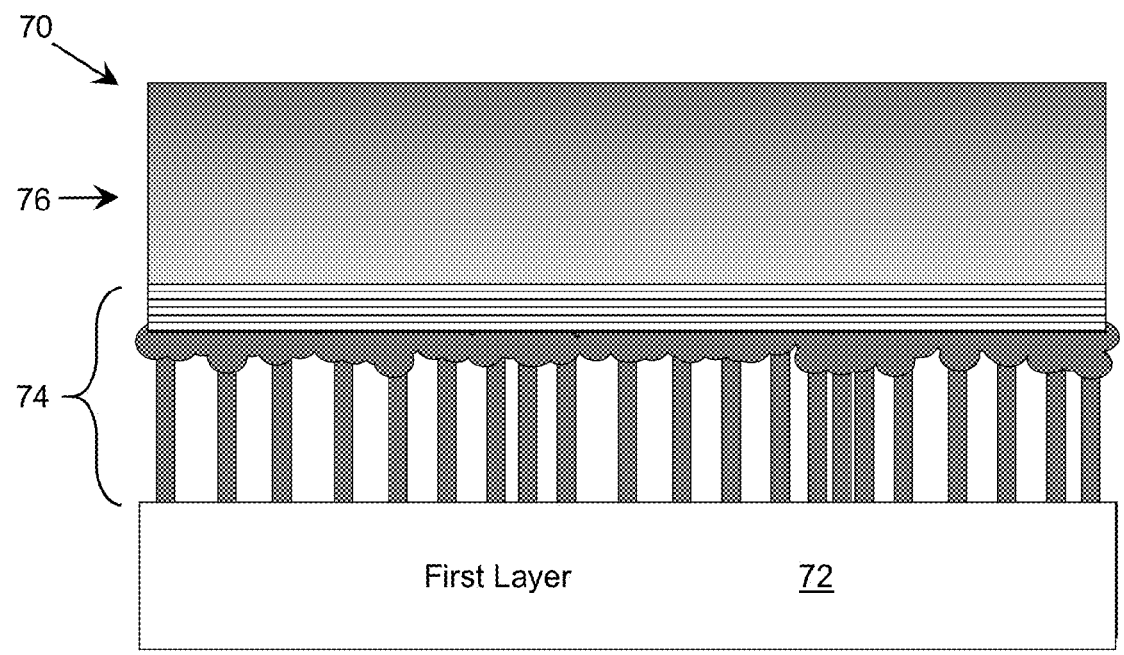
FIG. 9 shows an illustrative heterostructure including a composite semiconductor layer according to another embodiment.

Inclusion of a composite semiconductor layer described herein in a heterostructure can be combined with the inclusion of one or more layers having one or more features to further improve one or more characteristics of the resulting device. For example, FIG. 9 shows an illustrative heterostructure 70 including a composite semiconductor layer 74 according to another embodiment. For example, the composite semiconductor layer 74 can be formed on a first layer 72, which can have a substantially uniform composition. A second semiconductor layer 76 can be formed on the composite semiconductor layer 74 and have a graded composition, which can be configured to reduce stresses, or the like. For example, the graded semiconductor layer 76 can comprise a graded group III nitride composition, such as an AlGaN alloy, where a first side (e.g., adjacent to the composite semiconductor layer 74) is $Al_xGa_{1-x}N$, and the second side comprises $Al_yGa_{1-y}N$, where $x-y>0.05$, a thickness of the layer 76 being at least 50 nm, and $0<x$, $y<1$. In an embodiment, the composite semiconductor layer 74 is formed of AlN. The grading can be implemented using any solution, e.g., continuous grading, stepwise grading, and/or the like. While the layer 76 is described as being graded, it is understood that a sub-layer of the composite semiconductor layer 74 can be graded. To this extent, the grading of such a sub-layer can be similar to the grading described in conjunction with the layer 76.

Figure 10A:
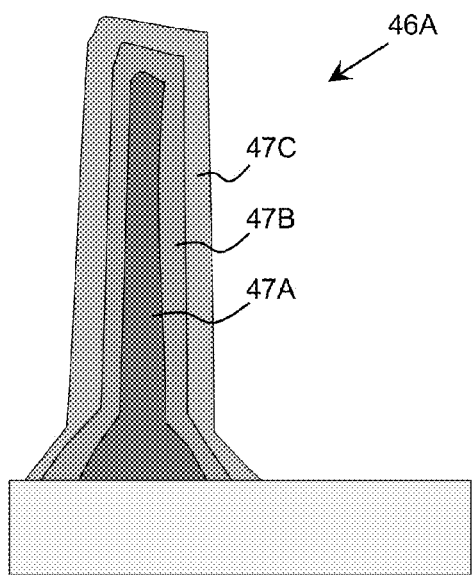
FIGS. 10A and 10B show illustrative columnar structures according to embodiments.
Figure 10B:
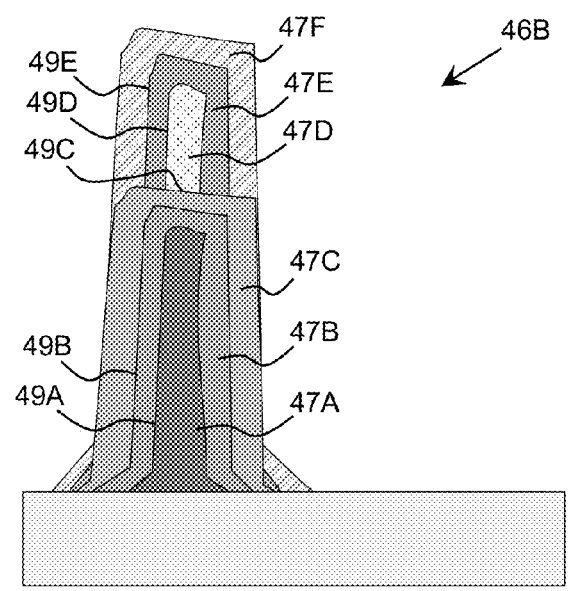

In an embodiment, one or more of the columnar structures of a composite semiconductor layer includes a variable composition. To this extent, FIGS. 10A and 10B show illustrative columnar structures 46A, 46B, respectively, according to embodiments. For example, the columnar structure 46A has a composition that changes as a function of the diameter of the columnar structure 46A. In an illustrative embodiment, the columnar structure 46A can have an inner core 47A having a composition of AlN or an $Al_xGa_{1-x}N$ alloy, followed by a layer 47B having a composition of $Al_yGa_{1-y}N$, where x and y differ by at least one percent, which can be followed by another layer 47C having a composition of $Al_zGa_{1-z}N$, where y and z differ by at least one percent. In another embodiment, the columnar structure 46A can have a graded composition as a function of the diameter of the columnar structure 46A. While the columnar structure 46A is shown including three layers 47A-47C, it is understood that a columnar structure having a variable composition can include any number of two or more layers.

An embodiment of a columnar structure can include a varying doping, e.g., to achieve a p-n junction, where the p-n junction is formed in a radial direction of the columnar structure. For example, in an embodiment, the inner core region 47A can have a p-type or n-type doping while the outer layer 47C is undoped. Alternatively, the inner core region 47A can have one of a p-type or n-type doping while the outer layer 47C has the other of the p-type or n-type doping. In either case, the layer 47B can have a doping that is selected to provide a transition between the dopings of the inner core 47A and the outer layer 47C.

FIG. 10B shows a columnar structure 46B where the composition and/or doping can change in both a radial and lengthwise direction to form a complex junction structure. In this case, the layers 47A-47C can have compositions and/or doping levels, which change at the two interfaces 49A, 49B between any of these layers 47A-47C. Furthermore, the composition and/or doping can be different for layers 47D-47F from those of the layers 47A-47C and can change abruptly or continuously at the interface 49C between the respective groups of layers 47A-47C and 47D-47F. When the change is continuous, the layers 47A-47C can be graded in the surface normal direction. Similar to the layers 47A-47C, the layers 47D-47F can have composition and/or doping levels which change at the corresponding interfaces 49D, 49E between any of these layers. In an embodiment, to change the composition and/or doping in a lateral direction of the columnar structure 46B, a two-dimensional growth solution can be utilized (e.g., a high temperature, low V/III ratio). For example, during this period, the growth temperature can be increased to a range of 1100-1400 C and/or a V/III ratio can be in a range of 500-2000. To change the composition and/or doping in a vertical direction, a three-dimensional growth solution can be utilized (e.g., a lower temperature and a higher V/III ratio). For example, during this period, the growth temperatures can be in the range of 600-1100 C (e.g., 800-900 C in a more specific embodiment) with an average V/III ratio on the order of 10000.

Figure 11:
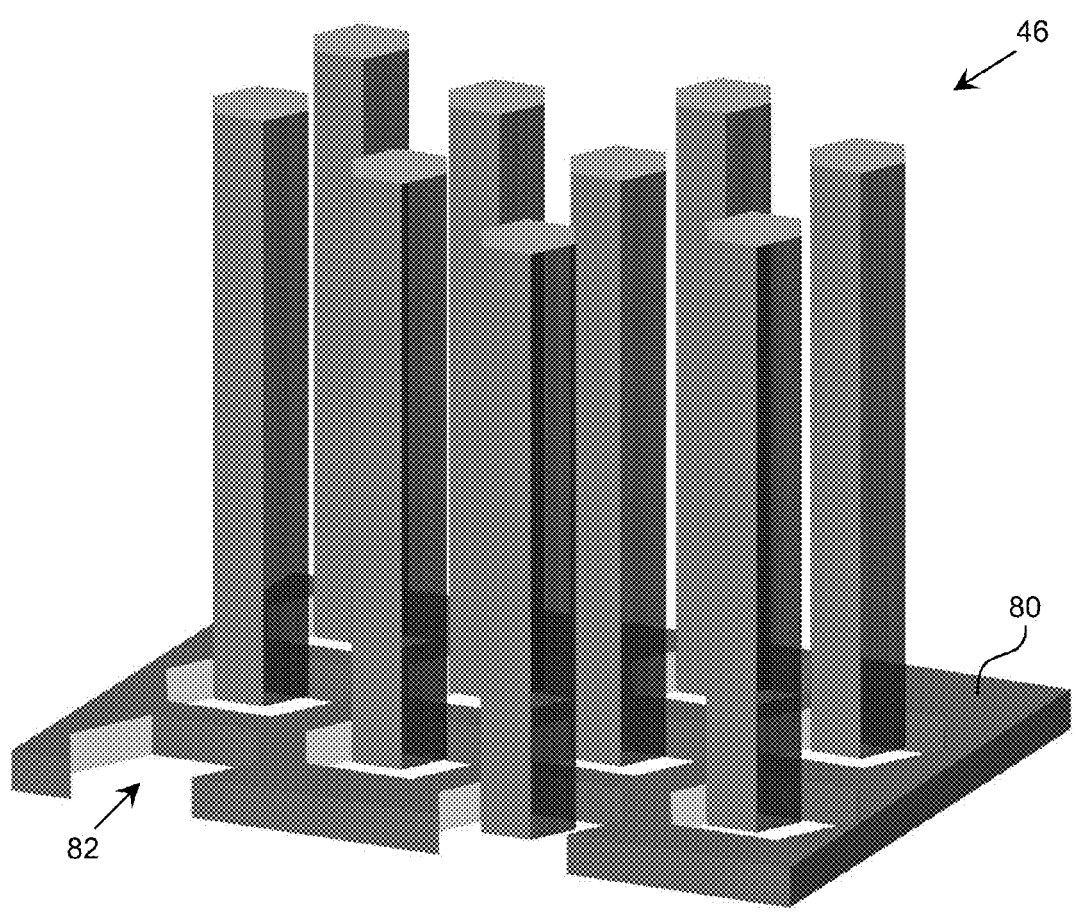
FIG. 11 shows an illustrative group of columnar structures grown on a template layer including a plurality of openings according to an embodiment.

In an embodiment, a template layer is used to promote the three-dimensional growth of the columnar structures. To this extent, FIG. 11 shows an illustrative group of columnar structures 46 grown on a template layer 80 according to an embodiment. As illustrated, the template layer 80 includes multiple openings 82 and growth of each of the columnar structures 46 originates in an opening 82 and can be guided by the openings 82. Use of a template layer 80 can provide for control of the characteristic diameter and/or characteristic separation of the columnar structures 46. In an embodiment, the template layer 80 is a layer of anodic aluminum oxide (AAO). Such an AAO layer can be fabricated using any solution, such as by depositing a thin layer substantially consisting of aluminum and performing an anodizing treatment to the aluminum layer (e.g., by causing the aluminum layer to oxidize), which can cause formation of the openings (pores) 82.

Figure 12:
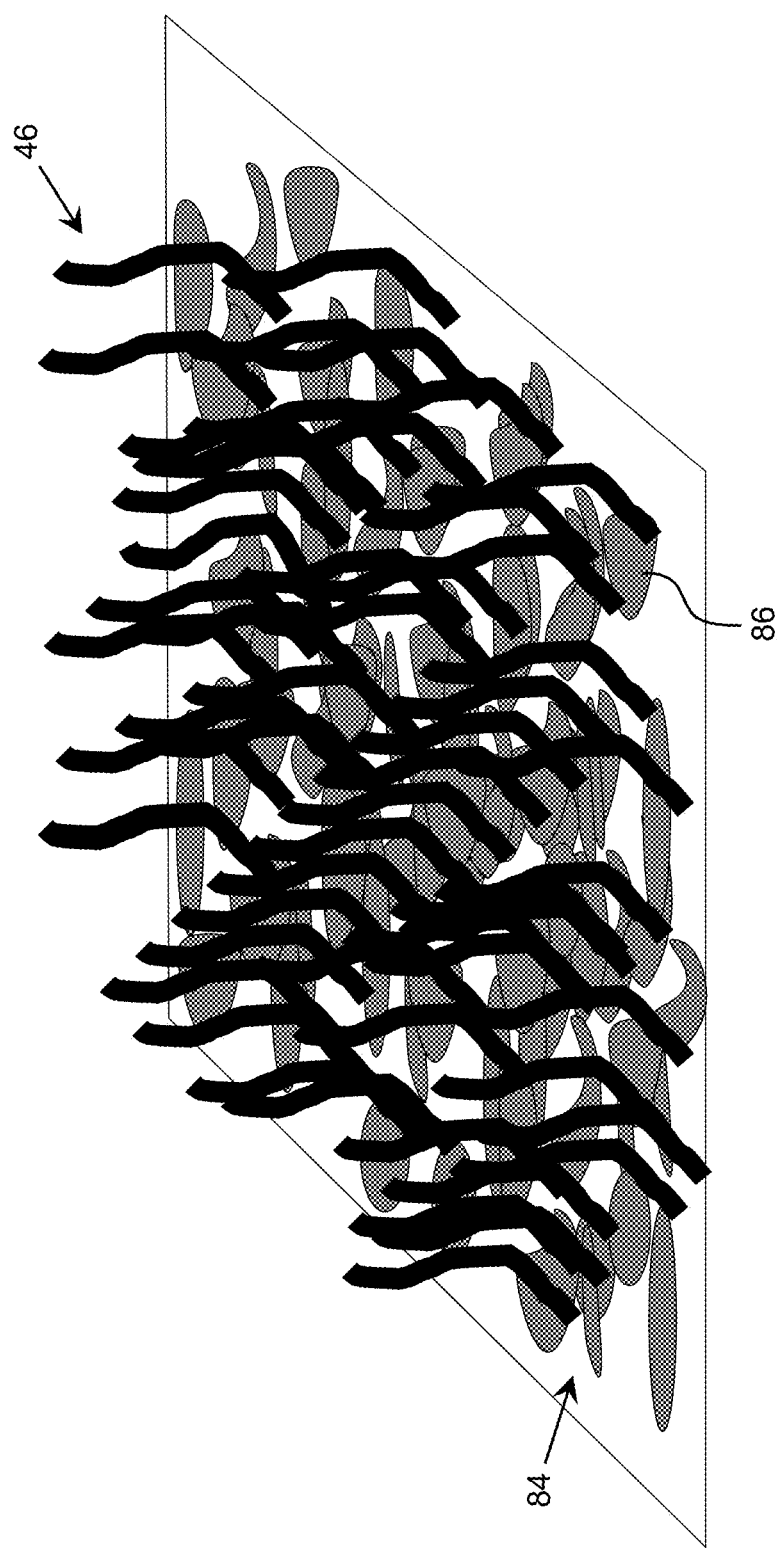
FIG. 12 shows an illustrative group of columnar structures grown on a template layer including plurality of islands according to an embodiment.

Alternatively, the template layer also can comprise a plurality of islands configured to facilitate growth of the columnar structures. To this extent, FIG. 12 shows an illustrative group of columnar structures 46 grown on a template layer 84 including plurality of islands 86 according to an embodiment. The islands 86 can be configured to facilitate growth of the columnar structures 46 thereon. The islands 86 can be formed of any suitable of metallic, semiconductor, or dielectric material including, for example, aluminum, titanium, metal-nitride islands (e.g., AlN, AlGaN, $Si_3N_4$, TiN, ScN, BN, and/or the like), dielectric islands (e.g., carbon, $SiO_2$, $ZrO_2$, $Al_2O_3$, and/or the like), anodized aluminum oxide, and/or the like.

It is understood that a template layer can include any combination of one or more masking and/or growth promoting sub-layers. For example, the template layer can include a dielectric mask with large openings (e.g., a characteristic size larger than a target wavelength of radiation) combined with finer islands (e.g., a characteristic size smaller than a target wavelength of radiation) located within such openings that promote three-dimensional growth of the columnar structures 46. Additionally, it is understood that a composite layer and/or heterostructure including multiple layers/sub-layers of columnar structures 46 can utilize the same or different template layers to promote the growth of the corresponding columnar structures 46.

Furthermore, the growth of columnar structures 46 can be performed without utilizing a template layer. For example, in an embodiment, growth of AlN columnar structures includes growing AlN nucleation islands under a high temperature in a range of 600-1500 C (e.g., in a range of 1100-1400 C in a more specific embodiment), a V/III ratio above 50 (e.g., above 1000 in a more specific embodiment, and about 5000 in a still more specific embodiment), and a growth pressure under 760 Torr (e.g., under 100 Torr in a more specific embodiment and under 50 Torr in a still more specific embodiment). During growth of the nucleation islands, a migration enhanced metal organic epitaxy can be utilized, in which both $NH_3$ and Trimethylaluminum (TMAl) are delivered through pulses. The characteristic size of the islands can be controlled by controlling the V/III ratio and/or temperature. For example, to decrease the characteristic size of the islands the V/III ratio can be increased and/or the growth temperature can be lowered. The set of growth conditions (e.g., a high growth temperature) can be selected to promote large Al-species diffusion at the growth surface. In an embodiment, growth of the islands continues until the islands have a target characteristic diameter in a range of 2-500 nm (e.g., a few tens of nanometers) and a characteristic separation distance between boundaries of the islands in a range of 20-1000 nm (e.g., a few tens of nanometers). Regardless, the growth is discontinued prior to a significant number of the islands coalescing.

The columnar structures can be grown over the nucleation islands using any solution. For example, the growth temperature can be reduced by approximately 100 C (e.g., in a range of 1200-1500 C in an embodiment and a range of 1300-1400 C in a more specific embodiment) and the V/III ratio can be increased above 50 (e.g., above 1000 in an embodiment and to approximately 10000 in a more particular embodiment). During growth of the columnar structures, a migration enhanced metal organic epitaxy can be utilized, in which both $NH_3$ and Trimethylaluminum (TMAl) are delivered through pulses. With a proper growth rate (e.g., a fraction of a micron per hour), the columnar structures are formed. It is understood that the characteristic parameters of the columnar structures will depend on the selected growth temperature, V/III ratio, growth rate, and/or the like. An advantage of this growth regime is the use of stable growth conditions. In an embodiment, at the end of the growth of the columnar structures, a small amount of Ga precursors can be added to form an AlGaN three-dimensional layer.

To promote coalescence of the columnar structures, the growth process can include a two-dimensional growth period. For example, during this period, the growth temperature can be increased to a range of 1300-1400 C, a V/III ratio can be in a range of 500-2000, and a growth rate can be approximately a few microns per hour.

Figure 13:
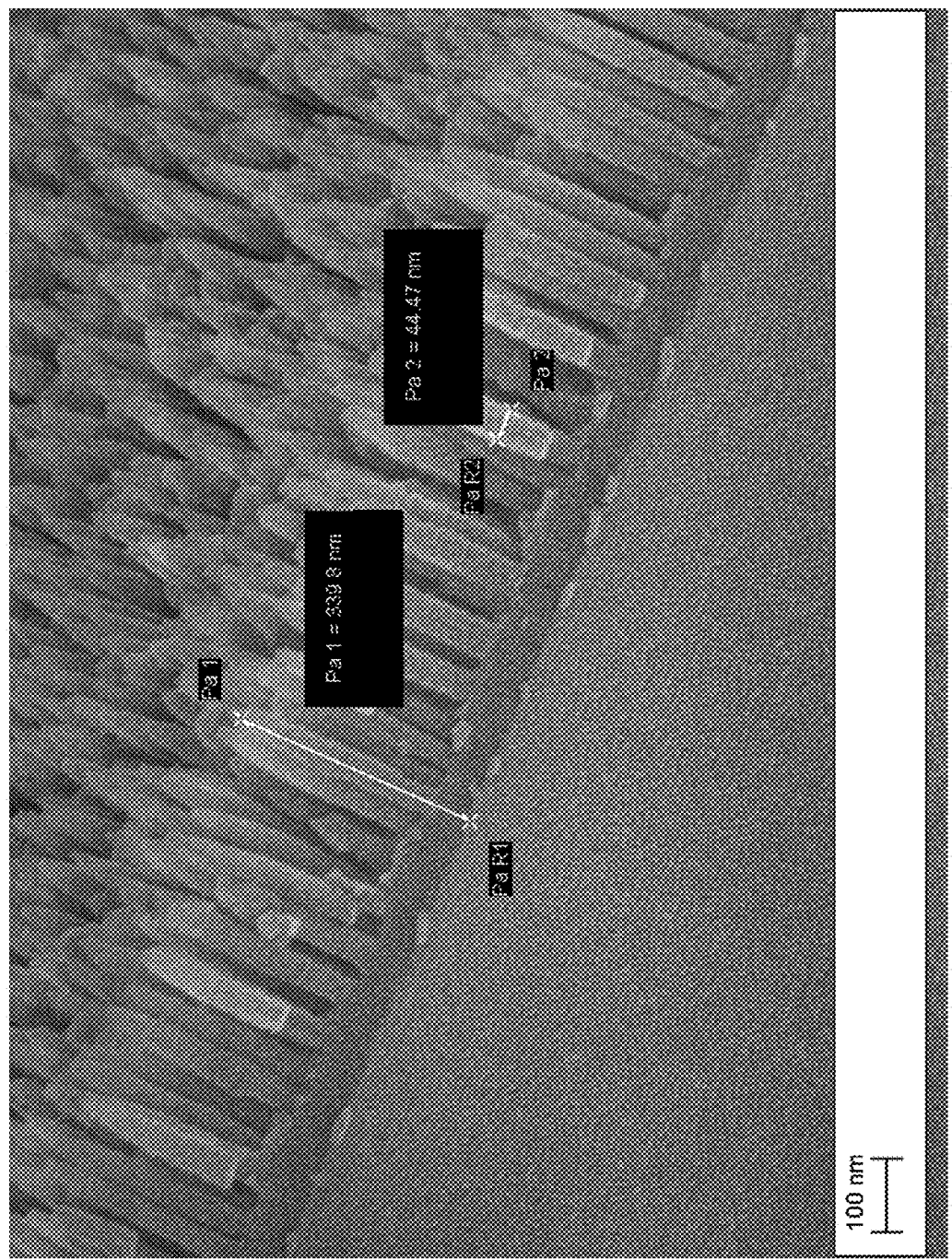
FIG. 13 shows a scanning electron microscope (SEM) image of an illustrative group of columnar structures according to an embodiment.

FIG. 13 shows a scanning electron microscope (SEM) image of an illustrative group of columnar structures according to an embodiment. The columnar structures were grown using the growth process without utilizing a template layer described herein. As illustrated in the image, the columnar structures have a characteristic length (height) of approximately 340 nm, and a characteristic width of about 45 nm, which results in a characteristic height-to-diameter ratio of about 7.5. The characteristic spacing is approximately 10-20 nm. The heights of the columnar structures have some variance and range between 300-400 nm.

In addition to relieving stresses originating within semiconductor layers and/or a substrate due to epitaxial growth and reducing threading dislocations within the semiconductor heterostructure, a composite semiconductor layer including columnar structures can be configured to improve radiation extraction from an optoelectronic device. For example, the columnar structures can have a characteristic diameter comparable with the wavelength of the emitted radiation. In this case, the columnar structures can provide light scattering and reduce a total internal refraction within the corresponding optoelectronic device. Inclusion of columnar structures having a characteristic diameter less than the wavelength of the emitted radiation can provide effective control of an averaged refractive index of the composite material. In particular, the refractive index of the composite material can be tailored such that it is lower than the refractive index of one immediately adjacent layer (e.g., the n-type layer 16 shown in FIG. 1) and higher than the refractive index of the other immediately adjacent layer (e.g., the substrate 12 shown in FIG. 1). Furthermore, by controlling the growth mode (e.g., selecting two-dimensional growth or three-dimensional growth), the refractive index can be controlled along a thickness of the composite semiconductor layer. For example, by using a two-dimensional growth mode, the diameter can be increased during growth of a three-dimensional layer.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

Figure 14:
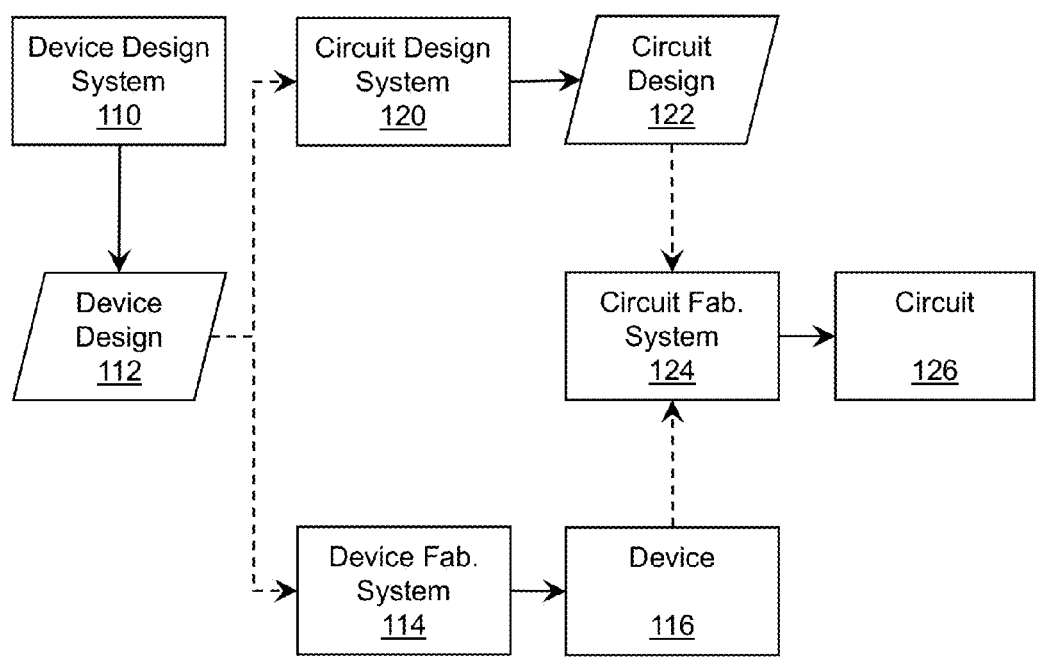
FIG. 14 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 14 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A heterostructure comprising:
    a composite semiconductor layer including a plurality of sub-layers, wherein the plurality of sub-layers includes:
        a first sub-layer comprising a plurality of nanowires with a characteristic spacing between each of the nanowires that ranges from 2 nm to 100 nm,
        a second sub-layer immediately adjacent to the first sub-layer, wherein the second sub-layer includes a partially continuous interior portion with isolated cavities formed therein, the isolated cavities having an arrangement distinct from the spacing between the plurality of nanowires, and wherein the plurality of nanowires of the first sub-layer contact the second sub-layer without penetrating into any of the isolated cavities.

2. The heterostructure of claim 1, wherein the composite semiconductor layer is formed of aluminum nitride.

3. The heterostructure of claim 1, wherein each of the plurality of nanowires has a characteristic diameter in a range of 5-500 nm, and a characteristic length in a range of 50 nm-5 microns.

4. The heterostructure of claim 1, the composite semiconductor layer further comprising a third sub-layer immediately adjacent to the second sub-layer, wherein third sub-layer is essentially continuous.

5. The heterostructure of claim 4, wherein the third sub-layer is a superlattice including a plurality of alternating tensile and compressive layers.

6. The heterostructure of claim 1, further comprising a substrate, wherein the composite semiconductor layer is immediately adjacent to the substrate.

7. The heterostructure of claim 6, wherein a top surface of the composite semiconductor layer has a curvature at least five percent less than a top surface of the substrate on which the composite semiconductor layer is located.

8. The heterostructure of claim 1, wherein a characteristic height-to-diameter ratio of each of the plurality of nanowires is at least one.

9. The heterostructure of claim 1, wherein the composite semiconductor layer further includes:
    a third sub-layer comprising a plurality of nanowires; and
    a fourth sub-layer immediately adjacent to the third sub-layer, wherein the fourth sub-layer is at least partially continuous.

10. The heterostructure of claim 9, wherein the plurality of nanowires of the third sub-layer have at least one characteristic dimension that differs from a corresponding at least one characteristic dimension of the plurality of nanowires of the first sub-layer by at least one percent.

11. The heterostructure of claim 1, wherein each of the plurality of nanowires has at least one of: a variable composition or a variable doping.

12. The heterostructure of claim 1, wherein the composite semiconductor layer further includes a template layer, wherein the template layer defines locations of the plurality of nanowires.

13. The heterostructure of claim 12, wherein the template layer includes a plurality of openings, and wherein the plurality of nanowires are located in the plurality of openings.

14. An optoelectronic device comprising:
    a sapphire substrate; and
    a buffer layer immediately adjacent to the sapphire substrate, wherein the buffer layer is formed of aluminum nitride and includes a plurality of sub-layers formed therein, wherein the plurality of sub-layers includes:
        a first sub-layer comprising a plurality of nanowires with a characteristic spacing between each of the nanowires that ranges from 2 nm to 100 nm; and
        a second sub-layer immediately adjacent to the first sub-layer, wherein the second sub-layer includes a partially continuous interior portion with isolated cavities formed therein, the isolated cavities having an arrangement distinct from the spacing between the plurality of nanowires, and wherein the plurality of nanowires of the first sub-layer contact the second sub-layer without penetrating into any of the isolated cavities.

15. The device of claim 14, wherein each of the plurality of nanowires has a characteristic diameter in a range of 5-500 nm, and a characteristic length in a range of 50 nm-5 microns.

16. The device of claim 14, further comprising a group III nitride n-type layer immediately adjacent to the buffer layer.

17. The device of claim 14, the composite semiconductor layer further comprising a third sub-layer immediately adjacent to the second sub-layer, wherein third sub-layer is essentially continuous.

18. A method comprising:
    growing a composite semiconductor layer including a plurality of sub-layers, wherein the plurality of sub-layers includes:
        a first sub-layer comprising a plurality of nanowires with a characteristic spacing between each of the nanowires that ranges from 2 nm to 100 nm; and
        a second sub-layer immediately adjacent to the first sub-layer, wherein the second sub-layer layer includes a partially continuous interior portion with isolated cavities formed therein, the isolated cavities having an arrangement distinct from the spacing between the plurality of nanowires, and wherein the plurality of nanowires of the first sub-layer contact the second sub-layer without penetrating into any of the isolated cavities.

19. The method of claim 18, wherein the growing includes growing the first sub-layer using a plurality of growth steps including:
    epitaxially growing AlN nucleation islands having a target characteristic diameter and a target characteristic spacing using a set of growth conditions promoting Al-species diffusion at the growth surface; and
    epitaxially growing the plurality of nanowires over the nucleation islands.

20. The method of claim 19, wherein the epitaxially growing AlN nucleation islands includes selecting at least one of: a V/III ratio or a growth temperature based on the target characteristic diameter.

* * * * *